US012763549B2

(12) United States Patent
Canoglu et al.

(10) Patent No.: US 12,763,549 B2
(45) Date of Patent: Oct. 13, 2026

(54) WAVELENGTH BANDWIDTH EXPANSION FOR TUNING OR CHIRPING WITH A SILICON PHOTONIC EXTERNAL CAVITY TUNABLE LASER

(71) Applicant: NeoPhotonics Corporation, San Jose, CA (US)

(72) Inventors: Ergun Canoglu, Cupertino, CA (US); Mark J. Dayel, San Jose, CA (US); Robert A. Carney, San Carlos, CA (US); David J. Dougherty, Pleasanton, CA (US)

(73) Assignee: Lumentum Operations LLC, San Jose, CA (US)

( * ) Notice: Subject to any disclaimer, the term of this patent is extended or adjusted under 35 U.S.C. 154(b) by 1042 days.

(21) Appl. No.: 17/962,137

(22) Filed: Oct. 7, 2022

(65) Prior Publication Data

US 2023/0113820 A1 Apr. 13, 2023

Related U.S. Application Data

(60) Provisional application No. 63/253,633, filed on Oct. 8, 2021.

(51) Int. Cl.
*H01S 5/14* (2006.01)
*G01S 7/481* (2006.01)
(Continued)

(52) U.S. Cl.
CPC .......... *H01S 5/141* (2013.01); *H01S 5/02453* (2013.01); *H01S 5/0612* (2013.01);
(Continued)

(58) Field of Classification Search
CPC ........ H01S 5/141; H01S 5/142; H01S 5/0612; H01S 5/02453
See application file for complete search history.

(56) References Cited

U.S. PATENT DOCUMENTS 9,608,406 B1 * 3/2017 Lee ........................ H01S 5/0612
2005/0286588 A1 * 12/2005 Guenter .................. G06F 3/038
372/50.1

(Continued)

FOREIGN PATENT DOCUMENTS

EP 3404780 A1 * 11/2018 ........... H01S 5/0057

OTHER PUBLICATIONS

Watts et al., Adiabatic Resonant Microrings (ARMs) with Directly Integrated Thermal Microphotonics, Conference on Lasers and Electro-Optics, Optical Society of America, 2009 (Year: 2009).*

(Continued)

*Primary Examiner* — James A Menefee
(74) *Attorney, Agent, or Firm* — Harrity & Harrity, LLP

(57) ABSTRACT

An external cavity diode laser has been developed to achieve a linear frequency chirp over a broad bandwidth using a silicon photonic filter chip as the external cavity. By appropriately chirping the cavity phase using the gain chip and/or a cavity phase modulator on the silicon photonic chip along with simultaneously varying the filter resonance, approximately linear frequency chirping can be accomplished for at least 50 GHz, although desirable structures with useful lesser chirp bandwidths are also described. With careful control of the chip design, it is possible to achieve predictable behavior of mode jumps along with large scannable ranges within a mode, which allows for stitching together segments of linear chirp through a mode jump to provide for very large chirp bandwidths greater than 1 THz.

24 Claims, 17 Drawing Sheets

(51) Int. Cl.
*H01S 5/024* (2006.01)
*H01S 5/06* (2006.01)
*H01S 5/10* (2021.01)

(52) U.S. Cl.
CPC ............ *H01S 5/1007* (2013.01); *H01S 5/142* (2013.01); *G01S 7/4814* (2013.01)

(56) References Cited

U.S. PATENT DOCUMENTS

| | | | | |
|---|---|---|---|---|
| 2008/0166134 | A1 | 7/2008 | McCallion et al. | |
| 2010/0085992 | A1* | 4/2010 | Rakuljic | G01S 7/4911 372/20 |
| 2011/0134957 | A1* | 6/2011 | Su | H01S 5/0265 372/50.22 |
| 2016/0299228 | A1* | 10/2016 | Maleki | G01S 17/42 |
| 2017/0040773 | A1 | 2/2017 | Chimot et al. | |
| 2019/0027899 | A1 | 1/2019 | Krishnamoorthy et al. | |
| 2019/0146091 | A1* | 5/2019 | Matsko | H01S 5/141 356/5.01 |
| 2020/0280173 | A1 | 9/2020 | Gao et al. | |
| 2021/0141058 | A1 | 5/2021 | Piggott et al. | |
| 2022/0094140 | A1* | 3/2022 | Tavallaee | G01S 7/497 |

OTHER PUBLICATIONS

International Search Report and Written Opinion for Application No. PCT/US2022/046070, mailed on Feb. 3, 2023, 11 Pages.

* cited by examiner

WAVELENGTH BANDWIDTH EXPANSION FOR TUNING OR CHIRPING WITH A SILICON PHOTONIC EXTERNAL CAVITY TUNABLE LASER

CROSS REFERENCE TO RELATED APPLICATIONS

This application claims priority to U.S. provisional patent application 63/253,633 filed on Oct. 8, 2021 to Canoglu et al., entitled "Wavelength Scanning and Bandwidth Expansion With a Silicon Photonic External Cavity Laser," incorporated herein by reference.

FIELD OF THE INVENTION

The invention relates to an external cavity laser with a silicon photonic chip providing the external cavity with rapid thermo-optical frequency adjustment for frequency tuning or chirping. The design of the thermo-optic heaters can provide significant bandwidth expansion while maintaining rapid frequency adjustment. The invention further relates to chirping across mode changes of the laser mode with appropriate stitching of the frequency ranges together for extended bandwidth capability. The chirping over extended bandwidth can be applicable to remote sensing such as LIDAR with higher resolution.

BACKGROUND OF THE INVENTION

Coherent tunable lasers are a vital and enabling element of optical telecommunications networks. These tunable lasers can provide desired functionality for other systems that can take advantage of the capability of these tunable lasers. In order to achieve these behaviors, the tunable laser can be designed as an external cavity laser (ECL). This means that the ECL structure comprises an optical amplifying element and other optical elements forming a compound optical resonator. This is in contrast to a standard semiconductor laser diode wherein the amplifying element and optical resonator are essentially one in the same on a single die. For telecommunications applications, optical filters within the compound optical cavity are adjusted to select the intended optical frequency and hold the required optical linewidth.

In other laser applications, the lasers can be directed to imaging or sensing. The ability to analyze and understand the 3D environment (3D Perception) is key to the success of robotic applications such as autonomous vehicles, UAVs, industrial robots etc. In mobile environments, 3D perception requires accurate and reliable object classification and tracking to understand current locations of objects as well as to predict their next possible move [1]. In applications such as autonomous driving car/UAVs, system may be required to identify and track many objects in real time. The 3D perception generally relies on LIDAR, which can stand for laser imaging, detection and ranging. Thus, the ability to separate dynamic objects from the static ones can enable prioritization of processing tasks to identify and focus on regions of interest (ROI) [2] leading to a faster response time.

In other applications such as industrial inspection/metrology, it may be desirable to create a 3D image with high depth precision and resolution. High resolution and precision 3D images can then be used in factory processes to improve quality and throughput. Similarly, for medical applications, high resolution 3D images can be used for diagnostic purposes for guiding treatment.

SUMMARY OF THE INVENTION

In a first aspect, the invention pertains to a method for providing a broadband chirped laser signal, the method comprising the step of scanning heater current simultaneously for a plurality of heaters in a silicon photonic chip connected as an external cavity of an infrared laser to achieve a bandwidth for an approximately linear chirp of at least about 50 GHz.

In a further aspect, the invention pertains to a tunable solid state laser device comprising:

- a semiconductor based gain chip; and
- a silicon photonic filter chip with tuning capability, wherein silicon photonic filter chip comprises a connection silicon waveguide, and at least two ring resonators formed with silicon waveguides, one or more interfacing silicon waveguides couple with the ring resonators, a separate heater associated with each ring resonator, wherein the one or more connecting silicon waveguides are configured to redirect light resonant with each of the at least two ring resonators back through the connection silicon waveguide, and
- wherein cavity phase is modulated using a controller to adjust the driving power to the gain chip or using a cavity phase modulator on the silicon photonic filter chip which further comprises a heater interfaced with the connection silicon waveguide or using both adjusting the gain chip power and the cavity phase modulator on the silicon photonic chip, and
- wherein the connection silicon waveguide of the silicon photonic filter chip is coupled to the semiconductor based gain chip with a spot size convertor to provide for mode size matching to reduce loss due to the interface and wherein chirping the voltage of the heater interfaced with the input-output silicon waveguide chirps the laser output frequency.

A high resolution, fast response LIDAR imaging system can comprise an imaging system comprising a transmitter and a receiver configured to receive reflected light, wherein the transmitter projects light in various directions at appropriate time to assemble a three dimensional image of objected in the field of view of the imaging system. The transmitter can comprises a chirped, tunable solid-state laser device as described herein.

In another aspect, the invention pertains to a tunable solid state laser device comprising:

- a semiconductor based gain chip; and
- a silicon photonic filter chip with tuning capability, wherein silicon photonic filter chip comprises a connection silicon waveguide, at least two ring resonators formed with silicon waveguides, one or more interfacing silicon waveguides couple with the ring resonators, a separate heater associated with each ring resonator and a tap directed to an optical device for evaluating frequency and phase shift to provide for accurate stitching of adjacent chirped frequency ranges to achieve an accurate extended chirped frequency range, wherein the one or more connecting silicon waveguides are configured to redirect light resonant with each of the at least two ring resonators back through the input-output silicon waveguide,
- wherein the connection silicon waveguide of the silicon photonic filter chip is coupled to the semiconductor based gain chip with a spot size convertor to provide for mode size matching to reduce loss due to the interface and wherein chirping the voltage of the heater interfaced with the input-output silicon waveguide chirps the laser output frequency.

In additional aspects, the invention pertains to a rapidly tunable solid state laser device comprising:

a semiconductor based gain chip; and a silicon photonic filter chip with tuning capability, wherein silicon photonic filter chip comprises an input-output silicon waveguide, at least two ring resonators formed with silicon waveguides, one or more connecting silicon waveguides interfacing with the ring resonators, a segment along each ring resonator wherein the waveguide core enlarges at a segment, and a separate heater associated with each ring resonator at the widened segment, wherein the one or more connecting silicon waveguides are configured to redirect light resonant with each of the at least two ring resonators back through the input-output silicon waveguide, wherein the input-output silicon waveguide of the silicon photonic filter chip is coupled to the semiconductor based gain chip with a spot size convertor to provide for mode size matching to reduce loss due to the interface.

DETAILED DESCRIPTION OF THE INVENTION

Figure 1:
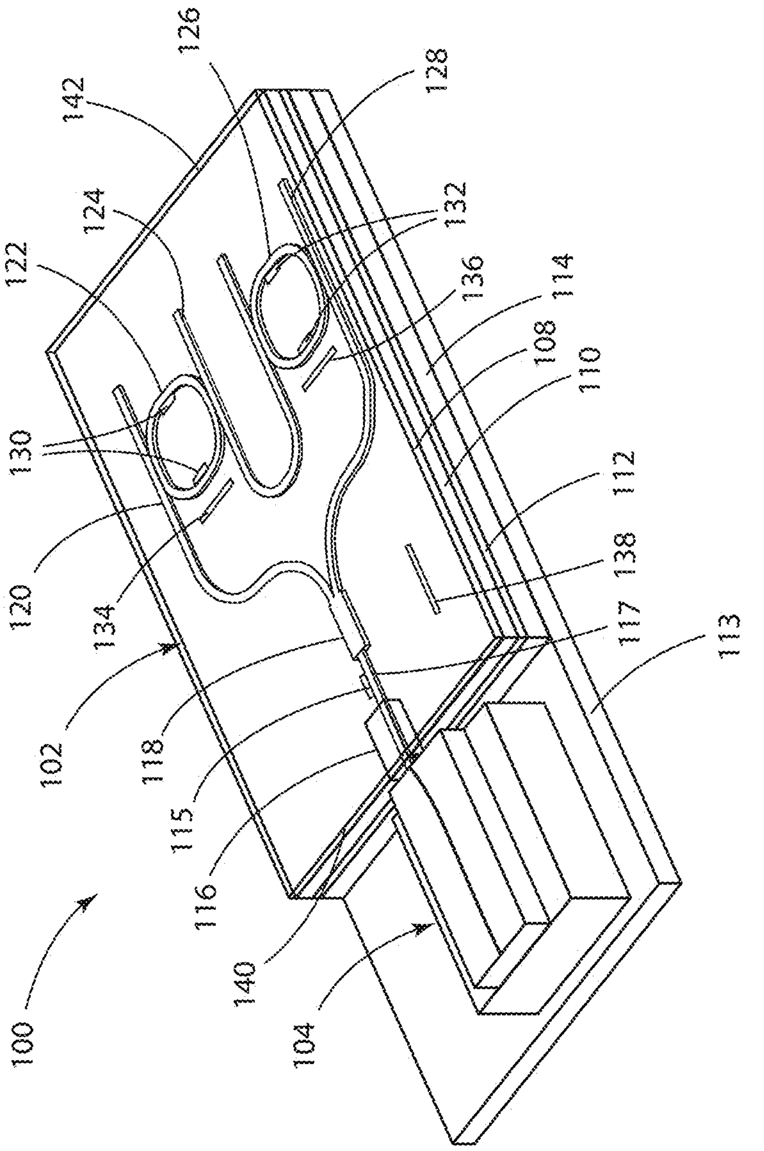
FIG. 1 is a perspective view of a tunable solid-state laser device that includes silicon photonic filter chip and semiconductor-based gain chip, according to one or more embodiments of the disclosure.

Silicon-based external cavity lasers (ECL) devices are described that provide for rapid wavelength tuning and/or well-behaved frequency sweeps, i.e., chirping. These ECL lasers with chirping can have significant applicability for LIDAR sensors, while the rapid tuning with the achievement of frequency locking can provide a desirable tunable laser for various applications, including optical telecommunication applications. In some embodiments, design features allow for a decreased thermal load to provide the wavelength tuning, such that the frequency response times can be decreased based on the delivery of rapid heating or the faster dissipation of heat. The ability to provide accurate but rapid frequency scanning or chirping can be based upon the introduction of a cavity phase adjustment in a silicon photonic external cavity or through the power delivered to the gain chip or with both adjustments. The cavity phase adjustment allows for linearization of the frequency scan as well as for maintenance of a sharp frequency spectrum in a lidar system utilizing frequency chirping. To provide efficient linearization, the laser is designed to have linearized chirping of the frequencies and remaining non-linearities can be corrected for with the controller efficiently since the non-linearities have been reduced. Appropriate scanning of the voltage to the heaters, and optionally to the gain chip, for the cavity phase adjustment and the tunable optical filter provide for broadband scanning of the frequencies, which in some embodiments have chirp rages over 50 GHz, although chirping with bandwidths over 1 GHz are generally useful. To provide for linear chirping over even greater ranges, chirping sections can be stitched together with accurate phase measurements to provide for accurate linear chirp over THz ranges.

The idea of stitching chirped frequencies from a plurality of distinct lasers has been describe previously. See, Vasilyev et al., "Multiple source frequency-modulated continuous-wave optical reflectometry: theory and experiment," APPLIED OPTICS, Vol. 49(10), 1 Apr. 2010, 1932-1937; and Vasilyev et al., "Terahertz Chirp Generation Using Frequency Stitched VCSELs for Increased LIDAR Resolution," CLEO Technical Digest, 2012, CF3C.1, OCIS codes: 140.3518, 280.3640, both of which are incorporated herein by reference. The stitching protocol described herein has advantages over this earlier work since only a single laser is involved while stitching over mode hops. This has the advantages of only using a single laser and simplifying the stitching since the frequency involves only one laser, which provide for improved practical implementation strategies.

In typical sensing applications such as lidar, chirped laser signal is split into transmit (Tx) and local oscillator (LO) copies. Tx optical signal is sent to the target to be sensed, and LO optical signal is used locally with in the sensing optical circuit to optically mix with the reflected signal from the target. This mixing process creates an electrical signal that contains a fundamental oscillation frequency that corresponds to the target distance. Linearity of the laser chirping as well as the total chirp bandwidth of the laser determines the resolution and the precision of the measurement. Higher linearity in chirping improves resolution and precision. Similarly wider chirping bandwidth improves the measurement resolution and precision. While widely tuning the laser, the coherence can be lost as the laser switches mode. This mode switch limits the chirp bandwidth of the laser in sensing applications, but a stitching signal from the laser can allow for measurement signal (i.e. the mixing signal) to be merged enabling larger chirp bandwidth across all lasing modes. A phase measurement can be used to accomplish the stitching of the frequencies across the phase jump to allow for continued chirping. The tunable optical filter comprises resistive heaters to provide the tuning. In some embodiments, the ring resonators are designed with segments having widened core cross sections to support light propagation with reduced evanescent electromagnetic fields penetrating outside of the waveguide in the vicinity of the heater so that the heater can be allowed for close placement of a heating element without excess optical loss to provide for increase bandwidth and for faster response times. The new designs are well suited for LIDAR applications, which can be applied using appropriate laser embodiments to high resolution application in biology or other settings.

In the optical telecommunications field, the explosive growth of network traffic, driven by video-on-demand, mobile, and cloud-based services has accelerated the penetration of high-capacity coherent transmission systems from long-haul into metro and inter-datacenter networks. Using the lasers described herein, a single laser mode can be used to tune a single passband across a wide tuning range and also provide a desirably narrow linewidth. Hence, practical ECL tunable lasers of this sort utilize two tunable filters, provided by optical rings, in the compound resonator. The compound resonator is suitable for tuning a fixed frequency or for chirping the frequency over a selected bandwidth. For fixed frequency operation, each of the tunable filters provides a comb of narrow passbands across the tuning range, and each filter is independently adjusted such that there is only overlap between one line of each filter, and the tunable laser emits narrowband light at that overlapping frequency. Silicon photonic external cavity lasers suitable for optical telecommunications applications are described in published U.S. patent application 2020/0280173 to Gao et al. (hereinafter the '173 application), entitled "Method for Wavelength Control of Silicon Photonic External Cavity Laser," incorporated herein by reference. Some of the designs herein incorporate common features from the lasers of the '173 application. Adjustments are made in the laser design herein to provide for even faster wavelength tuning. In addition, a heater associated with adjustment of cavity phase allows for rapid chirping of the frequency. Additional growth technologies can effectively adopt components from optical communication for providing effective functionality for these other applications, and the broadband chirping capability can provide desired functionality.

Three dimensional imaging is a component to a range of applications, such as self-driving vehicles to medical treatment and diagnosis to robotics and industrial processing. Imaging can be based on optical sensing using lasers, in particular LIDAR (Light Detection and Ranging). LIDAR generally makes use of continuous wave laser light sources to perform coherent, frequency modulated continuous wave (FMCW) operation. For imaging, the laser light is generally chirped, with frequency varying in time, to allow for interference of original and returned reflected light for the extraction of distance information. Laser designs with linear chirping over a broad bandwidth provide for precise position evaluation due to resolution being a function of chirping bandwidth.

Laser structures and methods are provided for accurate frequency control, and in some embodiments phase control, of tunable lasers using photonic integrated circuits in high-performance coherent modules for telecommunications, LIDAR or other applications. The tunable laser generally comprises a compound semiconductor material, such as gallium arsenide or indium phosphide, as the gain medium and a silicon photonic integrated circuit as the tunable frequency filter forming an external cavity of the laser. The silicon photonic circuit generally comprises silicon waveguide ring resonators as frequency selective elements or filter, which can be structured as an interferometer. The silicon photonic circuit can further include multiple integrated heaters to provide the frequency tuning. In general, the length of the silicon photonic chip can be determined to provide for improved chirping of the laser frequency. A longer laser cavity can assist with having a larger chirp bandwidth prior to having a mode jump. If a mode jump is encountered, structures are described to provide for stitching together the function of the laser frequency over time across the mode jump.

Laser tuning is accomplished through adjustment of an optical filter using an interferometer structure. The tuning is achieved through thermally adjusting the index of refraction of at least one or more segments of the waveguides in the filter. Modulation of the gain chip through adjustment of the current delivered to the gain chip can provide for an additional parameter for tuning the laser frequency and providing a frequency chirp. With respect to heating waveguides to adjust the effective optical path, if a smaller volume of optical material needs to be heated, the material can be heated and cooled faster to provide a faster tuning speed. While placing the heater closer to the waveguide can result in a smaller heated volume, close placement or contact can result in optical loss, which detracts from potential benefit from the faster response time. To reduce the optical loss while placing the heater adjacent the waveguide core, a section of waveguide at the heater can be structured as a waveguide segment with a significantly wider core relative to a narrower, single mode waveguide for the remainder of the chip waveguides. In particular, for a curved section of widened waveguide section connecting to segments of single mode waveguides, the fields from the light become concentrated along the outer edge of the widened waveguide so that the heater can be placed adjacent to the inner curve of the waveguide. In this way, the heater can be placed in close proximity to the waveguide for rapid tuning without resulting in unacceptable optical loss from light being transmitted through the heated waveguide. Resistive heaters can be formed using appropriate metals or with doped silicon or other conductive material with an appropriate amount of electrical resistance. In addition to shortening response times for frequency tuning, the closer placement of the heater allows for less heating due to reduced dissipation of heat while the heater is turned on, so there can be an additional energy savings. For some embodiments of the ring resonators in the filters, the rings can comprise two or more separate heated zones each with a widened waveguide core segment that are positioned away from coupling zones into/out from the ring into adjacent waveguides to reduce any interference in the coupling.

The adaptation of heaters directly into a Si resonator ring is described in Watts et al., "Adiabatic Resonant Mirrorings (ARMs) with Directly Integrated Thermal Photonics," CPDB 10, OSA/CLEO/IQEC 2009 (978-1-55752-869-8/09), incorporated herein by reference. See also, Watts-2013, cited below. The objective was to reduce power consumption and shorten response times relative to over cladding heaters. In the present devices, the frequency tuning can have a faster response time, and chirp rates can correspondingly be improved with a corresponding reduction in power consumption.

Figure 5:
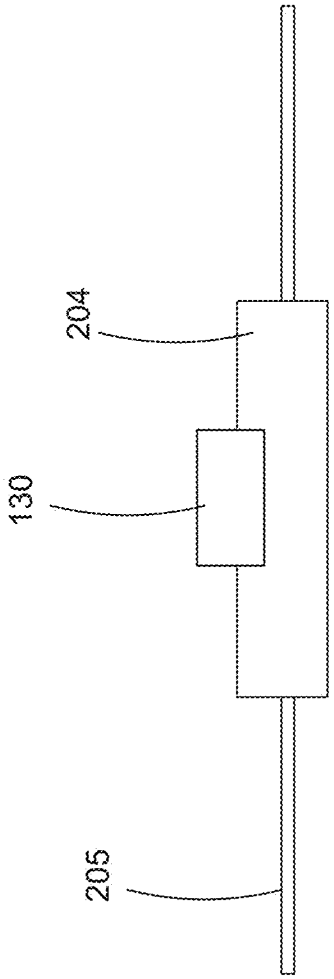
FIG. 5 depict a partial top view of an embodiment of a widened waveguide section and heater, according to one or more embodiments of the disclosure.

In some embodiments, where the laser frequency is chirped, the silicon photonic chip further comprises a cavity phase adjustment comprising a heater at a section of waveguide connecting the optical filter with an edge of the chip having a port. This phase adjustment provides for the chirping of the laser frequency. This heated segment of waveguide can further have a segment of wide core waveguide to allow for close placement of the heater element without resulting in unacceptable optical loss. While the waveguide at the heater for the cavity phase modulator can be straight, reduction in size and improvement in response time and thermal efficiency can be achieved by the introduction of widened curved waveguide sections, with the placement of the heaters at the inner edges of these curved sections. To provide for closer placement of the heater and for reduction of the heated volume, the cavity phase adjuster can comprise one curved segment, two curved segments, three curved segments or more, although the simplest structure would involve a straight waveguide as shown in FIG. 5. Specific embodiments with four curved segments are described below. Each curved segment can have a heater positioned at the edge opposite where the light intensity is effectively located. The cavity phase can be rapidly tuned by varying the current to the resistive heater to chirp the frequency.

To adjust the cavity modes, additionally or alternatively, the current to the gain chip can be adjusted. A higher current to the gain chip heats the waveguide in the gain chip that results in a frequency shift similar to the shift in the passive waveguides. This adjustment provides another parameter to allow for frequency chirping. The response of the laser with respect to current can be used to form a look up table in the controller so that the current can be adjusted to provide an approximately linear response of the frequency over time. Chirping of the gain chip in combination with the filter ring resonators can be similar to the chirping of a cavity mode heater with the filter heaters, and in some embodiments, the chirping of the gain chip resonator can be performed in addition to the use of a cavity mode modulator in the silicon photonic chip.

The physical size of the lasing cavity, which extends over both the gain chip and the silicon photonic external portion, influences the number of cavity modes as well as increasing coherence length to extend LIDAR range. The number of cavity modes correspondingly influences the chirping bandwidth without a mode jump. Thus, using a larger cavity can provide for a greater bandwidth, all else being equal. Large bandwidths for chirping can be achieved through simultaneously scanning the filter ring heaters and the cavity phase using either the gain chip current and or a silicon photonic cavity phase modulator.

The frequency chirping can be performed to have a linear time dependence.

$$f(t)=r\cdot t+f_0.$$

where $f_0$ is the initial frequency and r is the chirp rate. The linear time dependence corresponds to a saw tooth shape with a linear increase to a maximum value and then a linear decrease back to an initial value, back to an initial value, $f_0$. The range of the linear frequency variation is the chirp bandwidth. If the chirped laser is used for coherent depth measurement, the chirp bandwidth is related to the measurement resolution, so increased resolution is obtained for a greater bandwidth. For coherent depth measurement, a reflected signal is combined with a retained copy of the transmitted signal, and the resulting interference provides the depth measurement. A linear chip provides a greater sensing range as well as improved resolution and precision relative to a non-linear chirp. Performing coherent depth measurements with a chirped laser is described further in published U.S. patent application 2022/0291386 to Canoglu et al. (hereinafter the '386 application), entitled "LIDAR with 4D Object Classification, Solid State Optical Scanning Arrays, and Effective Pixel Designs." incorporated herein by reference. The use of the present lasers for these applications is described further below.

As described further blow, the components can be designed to provide approximate linear chirping over time with linear variation of power to the heaters. Through proper design, remaining nonlinearities can be corrected for using predictable adjustments to the currents. These adjustments can be programmed into a controller for performing the chirping. Then, conventional processors for a comparable external cavity laser can be adapted for this purpose as the controller for generating a linear chirp over a broad bandwidth.

As described in the '173 application, the laser light can be directed to exit a partially reflective mirror on the far side of the gain chip away from the silicon photonic external cavity. The light can be directed through a solid-state amplifier and continue to optical fibers or other components of an optical communication system. In other embodiments, it can be desirable to connect the laser to a silicon photonics component for performing other operations. To avoid the need for a further spot size conversion and associated optical loses, it can be desirable then to directly connect the silicon photonic chip forming the external cavity to a silicon photonic chip. For example, the '386 application teaches optical switch arrays using silicon photonics for performing transmission of the laser for performing LIDAR.

To achieve lasing from the silicon photonic external cavity, the split waveguide arms of the Sagnac interferometer functioning as the filter/reflector can be continued and joined at an optical connector where the resonance light can constructively interfere and continue propagation to the edge of the silicon chip. To provide appropriate leaking from partial reflection, the interface of the split waveguide arms with the respective ring resonators can be designed with appropriate reduced coupling to provide for reflecting most but not all of the light from the gain chip. With this design, the lasing can take place from the silicon photonic chip forming the external cavity, and the chip can be connected to another silicon photonic circuit or the like using an transparent adhesive or other suitable connector.

Figure 13:
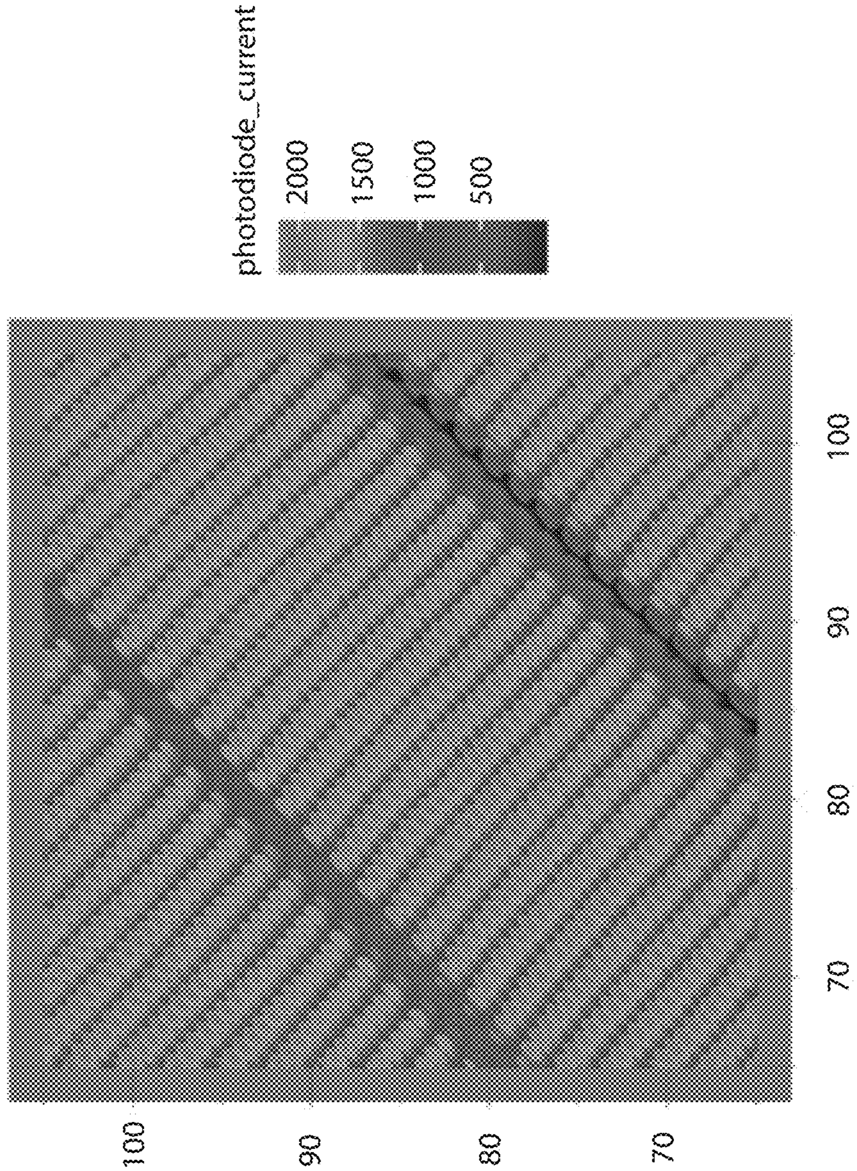
FIG. 13 depicts a map of laser output (photodiode current) as a function of the heater drive current to the two ring resonators in the filter.

The present laser designs generally result in a linear chirp frequency from a linear variation in heater voltage to produce a generally linear chirp without any need to use a more complex driving voltage. Silicon waveguides have a liner change of index of refraction as a function of temperature change since the thermo-optic effect is linear. The laser frequency is proportional to the cavity phase so that it linearly changes with waveguide temperature. While the heater power is a more complicated function of the driving current, for small modulating currents, the temperature change is linear with response to the change in modulating current. For larger modulating currents, a quadratic term of the modulating current can be calibrated out by precompensating the drive signal to remove the small non-linear term to retain the linear chirp. Prior to creating chirp, a laser can be first calibrated to create a map which identifies regions of stable operation. The map can be a diagram based on Ring1 and Ring2 temperature settings and stable operating regions. Each "island" of laser stability regions represents lasing at a specific laser cavity mode. FIG. 13 described below gives an example of such a map.

Through chirping the cavity phase, a chirp bandwidth on the order of 2-3 GHz can be achieved. With proper design of the ring heaters, the ring heaters and the cavity phase can be simultaneously chirped with the same varying current to linearly drive the laser frequency to give a very broad band chirp, such as from 150 to 200 GHz bandwidth, which is significantly more than generally believed needed for automobile focused LIDAR. Thus, for some applications, this amount of chirp can provide sufficient resolution. For higher resolution applications, such as medical coherence tomography or industrial metrology, higher resolution can be desirable. Continued shifting of the frequency can result in a mode shift of the laser that results in a loss of coherence with a discontinuous jump in phase. For even higher resolution from a broader chirping bandwidth, the chirping bandwidth can be extended by stitching together segments of linear chirping using an accurate phase offset to accurately stitch together the segments. In some embodiments, a delay line interferometer can be tapped off of the laser output to provide the accurate phase offset to stitch together the segments of the chirp, although other phase measurements can be used to obtain the phase offset. Other optical devices suitable to evaluate the frequency and phase can be used as an alternative to the delay line interferometer, such as a Fabre-Perot interferometer.

To obtain a linear chirp through simultaneously driving the ring heaters and the cavity phase heater, the silicon photonic chip also can be properly designed to facilitate obtaining a linear chirp frequency. By designing each ring resonator to have roughly the same thermal properties, a single drive signal is thereby able to drive the transmission peak of the tuning along the diagonal of equal ring resonator response. Choosing the cavity phase adjustment signal to have the same response (GHz per mW heating) as the ring resonator drive, the same signal can be used to drive the cavity phase. By chirping the three heaters with a single linearly varying voltage, the chirp voltage can be approximately linear over a very large chirp bandwidth. With appropriate design, the baseline voltage can also be the same.

External cavity tunable lasers in a small form factor are a significant component for high-capacity coherent optical communication systems to meet the ever increasing bandwidth demand. External cavity tunable lasers include two fundamental elements. The first element is a gain medium, generally using III-V compound semiconductors such as indium phosphide (InP) or gallium arsenide because of their direct energy bandgap and high efficiency at light generation. The second element is a frequency selective external resonating cavity. The external laser cavity ensures significantly long resonating cavity to suppress the laser phase noise, which is extremely important in various applications including high-speed coherent communication systems as they rely on not only amplitude modulation but also optical phase modulations.

External cavity lasers using silicon photonics technology are a promising solution to reduce the size and cost of tunable lasers. Silicon integrated circuits has been the focus of electronics industry over the last a few decades, and their technology advancement has led to a significant reduction in feature size, cost, and power consumption of the complementary metal oxide semiconductor CMOS circuits. Photonic integrated circuits promise similar low-cost and high-volume manufacturing through the adoption of mature CMOS foundries developed in electronics industry. The single-chip integration of discrete optical components of tunable laser, such as frequency selective elements, power monitoring photo diodes, and optical splitters, can lower the tunable laser cost through reducing the number of discrete components and through less-complex assembly.

The external portions of the ECL cavities in the silicon photonic chips generally comprise two or more ring resonators in silicon waveguides. The ring resonators functions as optical filters selecting appropriate frequencies. The filters are generally temperature sensitive and are typically tuned by deliberately adjusting and controlling the temperature of each filter component. It is effectively impractical to directly measure the frequency transmission of a filter in these applications, but it is demonstrated that the transmission can be sufficiently inferred by monitoring the filter temperature and applying a mathematical calibration. For optical communications applications with tuned fixed frequency, it would be desirable to accurately know the temperature at the optical path through the filter. However, since both the temperature sensor would absorb light and should not be positioned too close to the optical path, the sensed temperature is physically displaced from the optical path, and the actual temperature of the optical path is inferred. There are other thermal variations, such as changes in ambient temperature and temperature crosstalk between the filters, which can perturb the temperature inference. For free-space-based ECL, which has been the dominant architecture for existing commercial ECL, these couplings are weak and the resulting perturbations can be suppressed by thermal design and calibration enhancements. More information regarding etalon based ECL can be found for instance in U.S. Pat. No. 7,961,374 to Finot et al., entitled "thermal Control of Optical Filter With Local Silicon Frame," incorporated herein by reference.

The general concepts of external-cavity tunable lasers using silicon photonics technology are described in G. Valicourt et al., "Photonic Integrated Circuit Based on Hybrid III-V/Silicon Integration," J. Lightwave Technol. 36, 265-273 (2018), and A. Verdier et al., "Ultrawideband Wavelength-Tunable Hybrid External-Cavity Lasers," J. Lightwave Technol. 36, 37-43 (2018), both of which are incorporated herein by reference. Their CMOS-compatible fabrication processes and the on-chip integration of various optical components show great promise to lower the cost and size of tunable laser devices, as described generally in A. Novack et al., "A Silicon Photonic Transceiver and Hybrid Tunable Laser for 64 Gbaud Coherent Communication," OFC, Th4D.4 (2018), and C. Doerr et al., "Silicon Photonics Coherent Transceiver in a Ball-Grid Array Package," OFC, paper Th5D.5 (2017), both of which are incorporated herein by reference. Moreover, the integration of a booster semiconductor optical amplifier (SOA) provides a clear path to compensate for the relatively high coupling and propagation losses of the silicon waveguide. The use of a SOA with an external cavity laser is described in K. Sato et al., "High Output Power and Narrow Linewidth Silicon Photonic Hybrid Ring-Filter External Cavity Wavelength Tunable Lasers," ECOC, PD2.3 (2014), incorporated herein by reference. This combination allows long external silicon cavity design to reduce the laser spectral linewidth, while still achieving high output power.

Referring to FIG. 1, a tunable solid-state laser device 100 is depicted, according to one or more embodiments. In various embodiments the solid-state laser device 100 comprises a silicon photonic filter chip 102, and a semiconductor-based gain chip 104. In one or more embodiments the solid-state laser device 100 can further comprise a semiconductor optical amplifier (SOA), not shown. In various embodiments the SOA can be integrated with the device 100 through a lens coupling to the gain chip 104 for light amplification before the output fiber. In various embodiments, the photonic filter chip 102, and the gain chip 104 can rest on a temperature controller, such as a thermoelectric cooler (TEC) 113 to help control the overall device temperature. In such embodiments the TEC 113 and the overall device temperature may be controlled with a logical controller, described further below. TEC components are known in the art. For convenience, the solid-state laser device 100 with the filter chip 102, gain chip 104 and TEC 113 (if present) can be referred to as a tunable external cavity laser device, which generally would be assembled in a package.

In one or more embodiments, the silicon photonic filter chip 102 is a multi-layer photonic chip device comprising an upper cladding layer 108, a silicon device layer 110, a lower cladding layer 112, and a silicon substrate 114. In various embodiments the layers are arranged in filter chip 102 where the upper cladding layer 108 forms a top layer of filter chip 102 with the silicon device layer 110 being located between the upper cladding layer 108 and the lower cladding layer 112. In one or more embodiments, the lower cladding layer 112 is located on the silicon substrate 114, which forms a bottom portion of the filter chip 102.

In one or more embodiments, the upper cladding layer 108 and the lower cladding layer 112 are silicon oxide layers, although other low index of refraction optical material can be used in addition to or in lieu of silicon oxide. As used herein, the term silicon oxide refers generally to silicon suboxides with different oxidation states. For example, the term silicon oxide includes both silicon monoxide ($SiO_2$) and silicon dioxide ($SiO_2$). In various embodiments, the cladding layers thickness above and below the device layer generally can range from about 0.3 microns to about 3 microns.

In one or more embodiments the silicon device layer 110 is a layer of silicon oxide that comprises one or more "devices" such as waveguides and resonators embedded within. For example, silicon photonic chips generally comprise one or more silicon waveguides of elemental silicon, potentially with a dopant, that is embedded as cladding in a layer of silicon oxide, such as silicon dioxide ($SiO_2$). In various embodiments, one or more cladding layers confine the light in the silicon waveguide due to an index or refraction difference. Waveguides and other structures for the silicon photonic chips can be formed using photolithography or other appropriate patterning technique as known in the art. When utilizing a silicon oxide cladding, the processing can adapt techniques from silicon on insulator processing for microelectronics. Due to the high index of refraction of silicon, the silicon waveguide can have a thickness of about 0.2 microns to about 0.5 microns.

In various embodiments, and described further below, the silicon photonic filter chip 102 comprises a ring-resonator based filter that provides a tunable reflection back toward the gain chip. In such embodiments the filter chip 102 includes one or more ring resonator structures, which are curved silicon waveguides that can be used as a filter to provide for selection of a frequency for the laser. Each ring resonator provides for stable reflection of various harmonics. The resonator rings are placed adjacent to waveguides such that resonance frequencies are coupled between the waveguide by the ring. The waveguides are placed sufficiently close to the waveguides such that there can be good optical coupling without an undesirable degree of loss. In one or more embodiments, each ring is associated with a heater to provide both for frequency tuning and for control of the filter response. Thermal control can be used in some embodiments to control thermal fluctuations of the ring resonator frequencies and in other embodiments to chirp the laser frequency. For optical telecommunications applications with a tuned fixed frequency, using a plurality of ring resonators with slightly different spectral ranges allows for selection of the harmonic which provides the common frequency for the plurality of rings. The laser then lases at the common frequency. This selection process is described further in Sato et al., "High Output Power and Narrow Linewidth Silicon Photonic Hybrid Ring-Filter External Cavity Wavelength Tunable Lasers," ECOC, PD2.3 (2014), incorporated herein by reference. In certain embodiments, for chirping the laser frequency, it can be desirable for the plurality of rings to be approximately equivalent so that the plurality of rings facilitate a linear chirp with a linearly varying heater voltage.

In some embodiments, each ring resonator can also be associated with a temperature sensor, which may be a resistance temperature detector (RTD), to measure temperature associated with that ring within a particular temperature sensitivity, as explained below. In some embodiments, the silicon optical chip is designed with a RTD that is spaced away from heaters associated with the ring resonators so that the RTD can measure changes in chip temperature. The temperature measurement from the chip level RTD sensor can be used in the feedback loop for fixed frequency applications or to evaluate thermal control of the chip as well as reference heater currents.

In various embodiments, the silicon device layer 110 comprises a connection waveguide 117 associated with a cavity phase modulator 115, a spot size converter 116, such as a lens, a splitter-combiner 118, a first waveguide portion 120, a first ring resonator 122, a coupling waveguide portion 124, a second ring resonator 126, a second waveguide portion 128, a first heater 130, a second heater 132, a first ring-temperature sensor 134, a second ring-temperature sensor 136 and a filter chip temperature sensor 138. The spot-size-converter, such as lenses, can be designed to adjust the beam dimensions from one waveguide to another waveguide. Appropriate lens alignment is known in the art. See, for example, published U.S. patent application 2005/0069261 to Arayama, entitled "Optical Semiconductor Device and Method of Manufacturing Same," incorporated herein by reference. A multistage spot-size-converter is described in published U.S. patent application 2019/

0170944 to Sodagar et al., entitled "Multistage Spot Size Converter in Silicon Photonics," incorporated herein by reference.

In one or more embodiments, the spot-size converter 116 couples the silicon photonic filter chip 102 to the semiconductor-based gain chip 104 and provides mode size matching to reduce loss due to the interface between filter chip 102 and gain chip 104. In additional or alternative embodiments, a separate spot size converter could be placed between the gain chip 104 and the silicon photonic filter chip 102.

In one or more embodiments, the cavity phase modulator 115 comprises a heater interfaced with a section of connection waveguide 117. In various embodiments, the heater is configured to be driven using a modulation signal to adjust laser cavity phase and contribute to laser frequency modulation. For example, in various embodiments, cavity phase modulator 115 can be adjusted using one or more heaters that are positioned on or near the waveguide section associated with modulator 115. In such embodiments, the heaters can be driven by a current to thermally change the index of the waveguide to adjust the effective cavity resonance. The thermal change creates an index change that is proportional to the drive current which in turn creates a linear frequency modulation. Further, in such embodiments, having one or more heaters associated with adjustment of cavity phase allows for rapid chirping of the frequency.

Splitter-combiner 118 is coupled to connection waveguide 117 and first and second waveguide portions 120 and 128. Together splitter/combiner 118, first waveguide portion 120 and second waveguide portion 128 form portions of a multi-filtered Sagnac interferometer. Splitter-combiner 118 is configured to split an incoming light signal and direct a first portion to first waveguide portion 120 and a second portion to second waveguide portion 128. Splitter-combiner 118 is also configured to combine light received from first and second waveguide portions 120 and 128 and direct it back through waveguide section XXX to spot-size converter 116.

Generally, the first ring resonator 122, second ring resonator 126, first waveguide portion 120, coupling waveguide portion 124, and second waveguide portion 128 are fabricated in the silicon device layer 110. In various embodiments, upper cladding layer 108 is formed on top and around the ring resonators and waveguides, while lower cladding layer 112 is formed below. The ring resonators, waveguides and other silicon devices are generally surrounded by cladding. Appropriate silicon patterning techniques are used to form the silicon structures.

In various embodiments, first ring resonator 122 and second ring resonator 126 each comprise ring-shaped, such as circular or ellipse or oval shaped, waveguides configured to coupled-in light from adjacent waveguide arms into the ring and then transmit along the ring. In various embodiments, first ring resonator 122 is formed between a linear portion of first waveguide portion 120 and a linear portion of coupling waveguide 124 such that light can travel between first ring resonator 122, waveguide 120 and coupling waveguide 124. In one or more embodiments, first ring resonator 120 is formed such that a shortest path between the first ring resonator 120 and adjacent first waveguide portion 120 occurs at a point that adjoins at an engineered gap to provide desired evanescent coupling at a linear portion of first waveguide portion 120. Similarly, second ring resonator 126 is located between coupling waveguide 124 and second waveguide 128 such that light can travel between coupling waveguide 124, second ring resonator 126 and second waveguide portion 128. Consequently, a light path or channel between first waveguide portion 120 and second waveguide portion 128 is formed for light to travel in a generally lateral or radial direction via first ring resonator 122, coupling waveguide 124 and second ring resonator 126 to effectively reflect light that it resonant with both ring resonators back toward gain chip 104, except along the opposite arm. For return of the light, splitter/combiner 118 acts as a combiner to interfere the light from the respective waveguide arms. On resonance, the interference is constructive, and a standing wave can be established at such frequencies to support lasing.

In various embodiments, the dimensions and index of refraction of the ring resonators 122, 126 determine the resonance frequency and associated harmonics. Thus, heating ring resonators 122, 126 changes the index of refraction and thus changes the resonance frequency. As such, in one or more embodiments, each resonator is associated with one or more resistive heaters to provide for frequency tuning, for maintenance of a constant ring resonator temperature, or for frequency chirping. For example, in one or more embodiments a first heater 130 is associated with the first ring resonator 122 and a second heater 132 is associated with the second ring resonator 126. Various embodiments, the first ring-temperature sensor 134 is associated with the first heater 130 and the second ring-temperature sensor 136 is associated with the second heater 132. In such embodiments, the temperature sensors and configured to determine temperature of their respective heater.

In general, the silicon photonic chip can be operated in three different modes of operation for chirping. For a narrow frequency range, the ring heaters can be adjusted to a selected temperature to provide a desired resonance frequency from the filter, and the cavity phase heater can be scanned to chirp the frequency output of the laser. With a balanced design of the rings and heaters, a significantly broader chirp range can be achieved by scanning the current to the ring heaters and the cavity phase heaters simultaneously to correspondingly vary the heater power output for all the heaters at once. The approximate linear variation that can be achieved in the frequency by varying the ring heater power along with the cavity phase heater can be many times broader bandwidth.

The above chirping approaches assume that the laser remains in a single mode of operation. As chirping progresses, the laser can jump lasing mode, which results in a relatively minor, but not insignificant jump in frequency and phase. But the jump in frequency and phase can be evaluated using a tap and detector, such as with a time delay interferometers and two photodetectors. As the frequency is used to evaluate interactions with the chirped laser beam, the information relating to the frequency and phase jump can be used to stitch together the evaluation of the observed results to effectively yield very large chirp bandwidths, as described further below.

Figure 2:
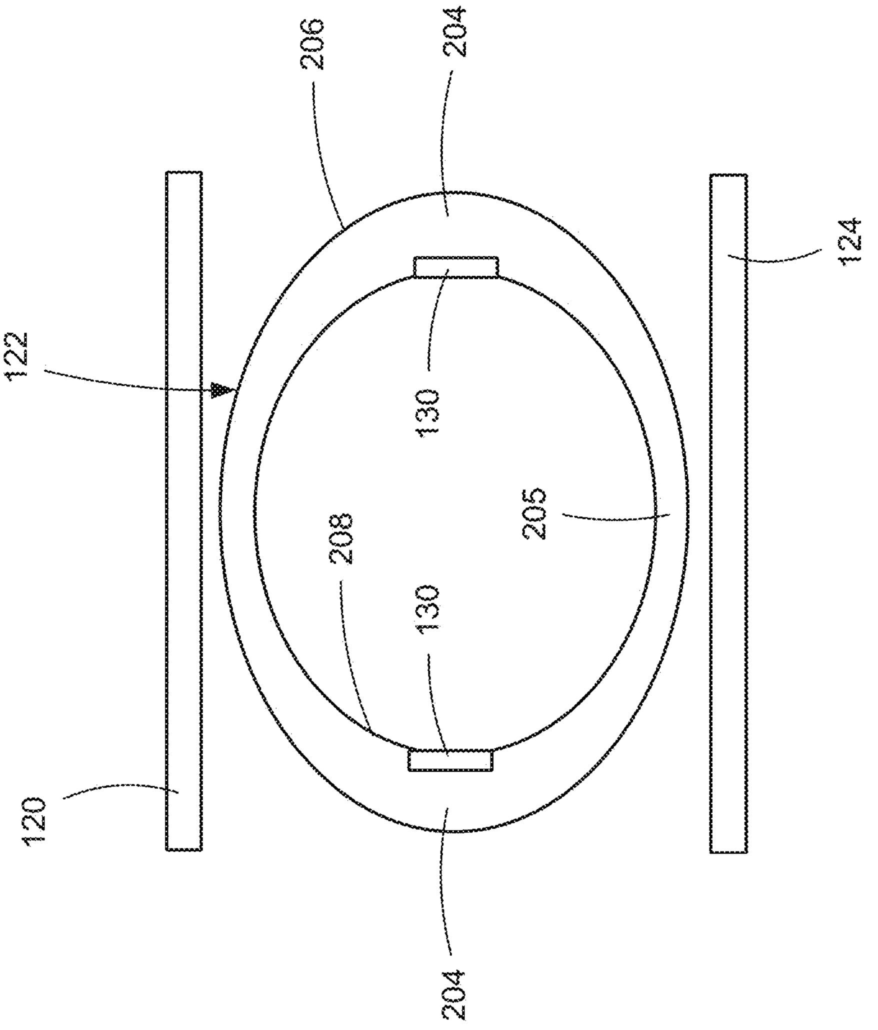
FIG. 2 is a partial top-down view of a ring resonator with widened waveguide core segments and heaters, according to one or more embodiments of the disclosure.
Figure 3:
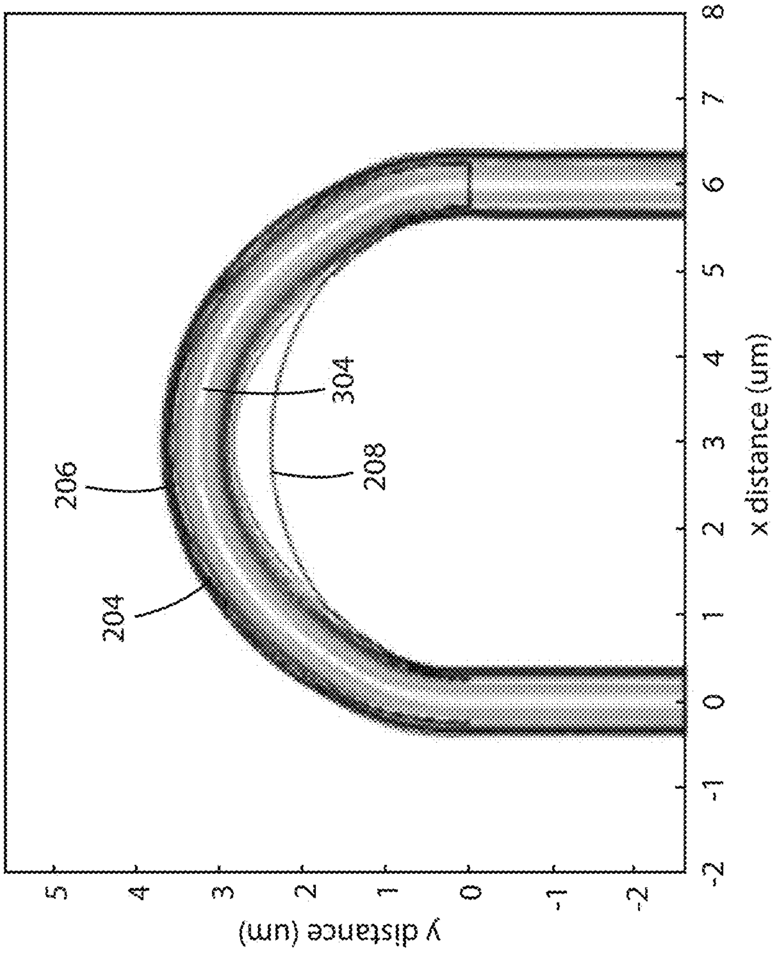
FIG. 3 is a plot of the modeled electric field in the vicinity of a widened waveguide core segment depicting a light propagation path around the widened curve.
Figure 4A:
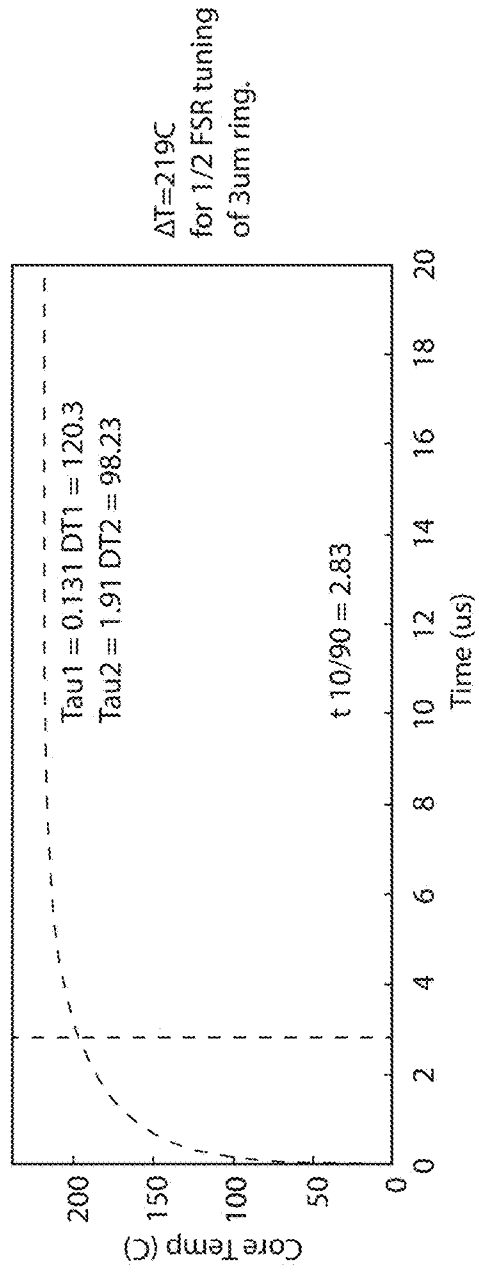
FIG. 4A is a diagram of waveguide core temperature versus temperature rise time in a ring resonator with a widened waveguide core segment and heater, according to one or more embodiments of the disclosure.
Figure 4B:
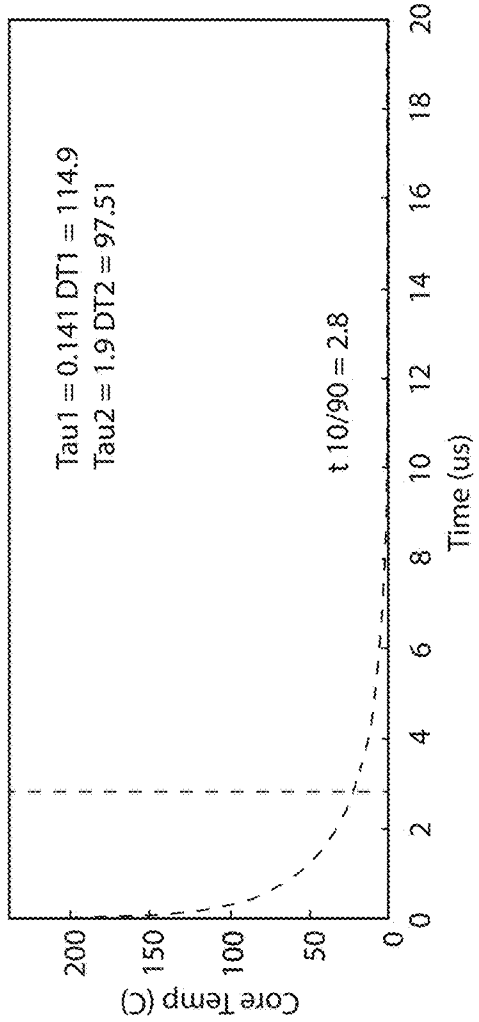
FIG. 4B is a diagram of waveguide core temperature versus temperature fall time in a ring resonator with a widened waveguide core segment and heater, according to one or more embodiments of the disclosure.

Referring additionally to FIGS. 2-4, in some embodiments, ring resonators 122, 126 are designed with one or more widened core segments 204 each having a widened core cross section relative to other parts of the ring resonator core. This is depicted in FIG. 2 for first ring resonator 122, but the structure for second ring resonator can be equivalent. The remaining, non-widened, segments 205 generally have a core dimension for single mode transmission for an optical band intended for the device. In one or more embodiments, the widened core segments 204 are curved segments of the ring resonator. In such embodiments, the fields from the light in the curved widened segments become concentrated along an outer edge 206 of the widened core segments 204.

The metal associated with the heaters can be in contact with the waveguide since the shifting of the fields to an alternative portion of the waveguide allows for acceptable optical loss. In some embodiments, the widened core segments 204 are separately heated zones each with a heater 130 positioned on an inner edge 208 of the widened core segment 204. In one or more embodiments widened core segments are positioned away from coupling zones into/out from the ring into adjacent waveguides to reduce any interference in the coupling. Simulations have been used to evaluate optical loss as a function of amount of widening of the waveguide in the context of a Mach-Zehnder interferometer, see Watts et al., "Adiabatic thermo-optic Mach-Zehnder switch," Optics Letters, 38(5), 733 (2013) (hereinafter Watts-2013), incorporated herein by reference. Watts-2013 found a flat minimum at widths from about 0.8 microns to about 1.3 microns for a single mode waveguide core of 0.4 microns. For less amounts of widening, losses were attributable to scattering from the heater, and for greater amounts of widening, losses were attributed to multimode propagation.

In such embodiments, the widened core segments 204 support light propagation but with reduced electromagnetic fields penetrating outside of the waveguide or near the section of the waveguide in the vicinity of the heater 130. For example, depicted in FIG. 2, the heaters 130 are positioned approximately at the widest portion of the widened core segments. In various embodiments, the widened core sections 204 are curved. In such embodiments and depicted with respect to the light intensity in FIG. 3, where the widened segment is curved the optical path through the waveguides abuts or concentrates against the outer edge 206 of the waveguide and thus away from the inner edge 208, where heater 130 is placed. As such, the curved shape of the section 204 assists to reduce the optical loss effect by spacing the heater further from the optical path while still positioning the heater against the waveguide. Thus, heaters 130 can be allowed for placement close to or in contact with the ring resonator core without excess optical loss to provide for increase bandwidth and for faster response times. In certain embodiments, the widened core segments 204 are widened sections of ring resonators 122, 126 that are connected to relatively narrower single mode waveguide segments. In various embodiments the width of the widened segment is at least about 1.5 times wider and in other embodiments from about 2 times to about five times the width of the non-widened or single mode portions of the waveguide or ring resonator. For example, in certain embodiments the width of the widened segment is approximately 50 microns while the width of the than the non-widened or single mode portions of the ring resonator is approximately 9 microns.

While some embodiments depict the widened core segment as curved, in various embodiments the widened core segments can be linear segments of waveguide. For example, Referring to FIG. 5, a partial top view of an embodiment of a linear widened waveguide section and heater is depicted. In such embodiments, like the curved core segments, the linear segments support light propagation but with reduced electromagnetic fields penetrating the outside of the waveguide at or near the heater 130. In one or more embodiments the optical path through the waveguide concentrates at the center of the waveguide and thus away from inner edge 208, where heater 130 is placed. As such, the curved shape of widened core segment 204 assists to reduce the optical loss effect by spacing the heater further from the optical path while still positioning the heater against the waveguide Referring to simulated plots in FIG. 4A-4B, in various embodiments, placing the heater closer to the waveguide results in a smaller heated volume of core. If a smaller volume of optical material needs to be heated, the material can be heated and cooled faster to provide a faster tuning speed. Further, because various embodiments place the heaters 130 at the widened core segments 204, optical loss is acceptably low. In addition to shortening response times for frequency tuning, the closer placement of the heater allows for less heating due to reduced dissipation of heat while the heater is turned on, so there can be an additional energy savings.

To understand the thermal response times, a ring resonator as shown in FIG. 2 with a three micron average radius was simulated. In the simulation, current was applied to heaters to drive the temperature to 219° C., and the temperature was monitored with a simulated sensor positioned inside the waveguide close to the heater as a function of time in the simulation of the thermal behavior. The temperature rise is plotted in FIG. 4A, and it took 2.83 microseconds to reach 90% of the final temperature. Turning the current off, it the cooling was similarly monitored, and the cooling is plotted in FIG. 4B. In the simulation, it took 2.8 microseconds to cool 90% back to the baseline temperature.

In certain embodiments, each ring resonator 122, 128 can also be associated with a temperature sensor, which may be an RTD, to measure temperature associated with that ring within a particular temperature sensitivity. The RTD sensors need to be further from the core than the heaters, so their response time will be significantly slower than the heaters and significantly insensitive to the actual temperature at the core. Generally, an RTD sensor can be placed over the top cladding. Ring RTD can still be useful especially if the ring is not chirped. In some embodiments, the silicon optical chip is designed with a RTD that is spaced away from heaters associated with the ring resonators so that the RTD can measure changes in chip temperature. An RTD placed away from the heaters can provide useful information on the general drift of the chip background temperature that can be accounted for in the laser operation. The temperature measurement from the chip level RTD sensor may be used in the feedback loop if the laser frequency is locked for telecommunications function.

Referring again to FIG. 1, in various embodiments each of first waveguide portion 120 and second waveguide portion 128 may be shaped having a linear section joined by a curved section, as depicted, to branch away from splitter/combiner 118 to pass alongside the respective ring resonators 122, 126. In other embodiments, first and second waveguide portions 120 and 128 may define other shapes that include linear and curved portions. In an embodiment, first waveguide portion 120 is symmetrical to second waveguide portion 128 about a longitudinal axis of photonic chip 102 that extends from first end (front end) 140 of photonic chip 102 adjacent gain chip 106 toward second end (rear end) 142 of photonic chip 102, opposite gain chip 106. Due to the looping nature of the Sagnac interferometer, whether first waveguide portion 120 and second waveguide portion 128 are symmetric may not be generally significant, although for linear chirping described herein, symmetric embodiments may provide a significant design advantage. In an embodiment, and as depicted, each of first and second waveguide portions 120 and 128 terminate adjacent second end 142, such that any non-resonant light generally dissipates.

In further embodiments described below, first waveguide portion 120 and second waveguide portion 128 meet on the far side of the chip away from the gain chip and combine at a combiner, and this construction provide for lasing from the silicon photonic chip if the coupling between waveguide arms 120, 128 and respective rings 122, 126 are tuned away from 50:50 so that the Sagnac interferometer functions as a partial mirror.

Coupling waveguide portion 124, in an embodiment substantially forms a "U" shape with a curved middle section adjoin a pair of linear portions and is located between first ring resonator 122 and second ring resonator 126. Coupling waveguide portion 124 is positioned sufficiently close to first ring resonator and second ring resonator that the elements are optically coupled. Coupling waveguide portion 124 provides for reversing the direction of the light transmission so that the light signal propagates in opposite are back in the opposite direction back toward the gain chip. Although depicted as a "U" shape with a curved middle section, it will be understood that coupling waveguide portion 124 may define other shapes. In an embodiment, each end of coupling waveguide portion 124 extends axially beyond first and second ring resonators 122 and 126 and terminate adjacent second end 142. Alternatives to the "U" shape are described below.

In one or more embodiments, the gain chip 104 can be a gain chip used in ECL having free space filters. Suitable gain chips are described in U.S. Pat. No. 6,882,979B2 to Daiber, entitled "External Cavity Laser With Continuous Tuning of Grid Generator," and U.S. Pat. No. 8,462,823B2 to Daiber et al., entitled "Small Package Tunable Laser With Beam Splitter," both of which are incorporated herein by reference. The gain chip and the SOA are generally based on similar semiconductor technologies. The gain chip and SOA differ in specific function and, therefore, can be designed with different optimizations in mind. Specifically, the gain chip provides a portion of the laser cavity so that its front surface is partially reflective to set up the standing wave to drive coherent stimulated emission for lasing. The SOA is not part of the laser cavity and can be designed accordingly to just provide power gain to optical transmissions through the SOA. The compositions of the gain chip and the SOA are generally distinct, and the coupling of the waveguides can account for the distinct waveguide dimensions, such as with a spot-size converter.

Figure 6:
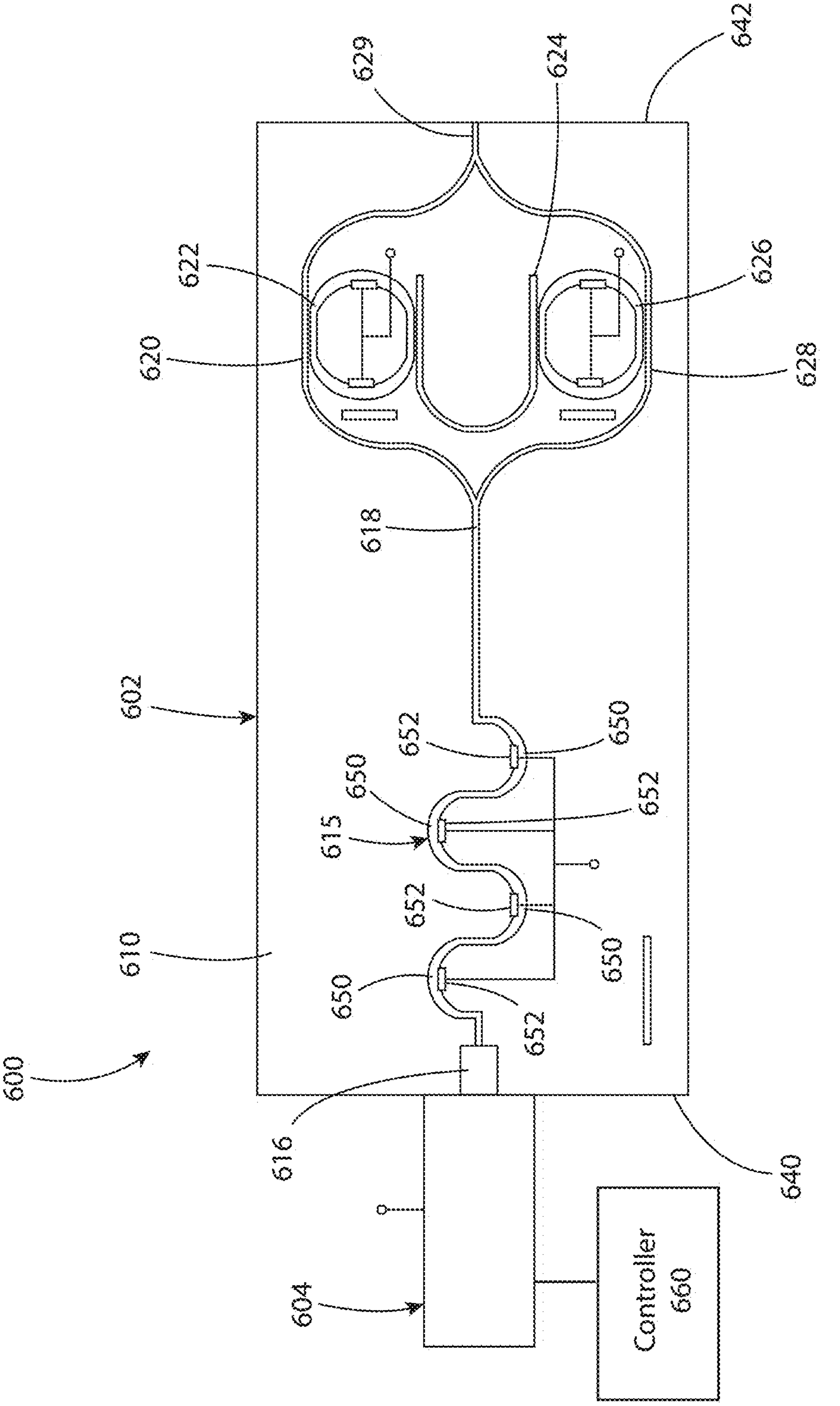
FIG. 6 depicts a top view of an embodiment of a tunable solid-state laser device that includes silicon photonic filter chip and semiconductor-based gain chip, according to one or more embodiments of the disclosure.

FIG. 6 depicts a schematic top view of an embodiment of the silicon device layer 610 of a tunable solid-state laser device 600, according to one or more embodiments of the disclosure. As shown in the figure, solid-state laser device 600 comprises a silicon photonic filter chip 602, and a semiconductor-based gain chip 604 coupled with the photonic filter chip 602 via a spot-size converter 616 that provides mode size matching. Silicon photonic filter chip 602 can comprise a silicon-on insulator construction with multiple stacked layers of silicon oxide on a silicon wafer including an upper cladding layer, lower cladding layer, and an element silicon device layer 610 with silicon structures surrounded by silicon oxide cladding. FIG. 6 depicts a schematic top view of the silicon device layer 610, which comprises one or more "devices" such as waveguides, resonators, and the like embedded within. Depicted in FIG. 6, the silicon device layer 610 comprises a connection waveguide 617 with a cavity phase modulator 615, a first splitter-combiner 618, a first waveguide portion 620, a first ring resonator 622, a coupling waveguide portion 624, a second ring resonator 626, a second waveguide portion 628, controller 660, and a second splitter-combiner 629. In comparison with the silicon photonic chip depicted in FIG. 1, silicon photonic chip 602 of FIG. 6 has a cavity phase modulator 615 designed for rapid tuning and the second splitter-combiner 629 provides for lasing off of the silicon photonic chip.

For improvement of the response time of cavity phase modulator 615, to help guide the light intensity to an edge of the multimode waveguide to allow of placement of the heater at the far edge (edge with smaller bend radius), the widened core segments 650 can be curved. As shown in FIG. 6, cavity phase modulator 615 comprises four curved segments 650 each with a widened segment. Each curved segment is associated with a heater 652 placed in the silicon layer at or immediately adjacent the inner portion of the widened segment. As noted above, placement of the heater at an inner edge of a widened curved waveguide allows for rapid tuning relative to other heater designs with relatively low optical loss. While shown with four curved segments, one, two, three, or more than four segments can be used to meet design targets. Each curved segment can have a heater positioned at the edge opposite where the light intensity is effectively located. The cavity phase can then be rapidly tuned to chirp the frequency.

As shown in FIG. 6, first waveguide portion 620 and second waveguide portion 628 extend from the first end 640 of the photonic chip 602, adjacent the gain chip 604, toward the second end 642 of the photonic chip 602. In various embodiments first waveguide portion 620 and second waveguide portion 628 each have a linear section that is joined by a curved section that branches to/from the first and second splitter/combiner 618, 629 to pass alongside the respective ring resonators 622, 626. However, in contrast with embodiments depicted above where each of first and second waveguide portions 622 and 626 terminate toward or adjacent the second end 642, depicted in FIG. 6, the first waveguide portion 620 and second waveguide portion 628 are joined via second splitter combiner 629 to provide a lasing waveguide positioned adjacent second splitter/combiner 629 for connection with an external optical circuit at second end 642 of photonic chip 602. Further in such embodiments, the gain chip 604 can comprise a mirror on the far side of the gain chip away from the silicon photonic chip 602.

Controller 660 may comprise a microcontroller, microprocessor, digital processor, or similar, or combinations thereof, as well as memory of appropriate kinds known in the art, and other control electronics. As also described above with respect to FIG. 1, filter chip 102 comprises first and second heaters and associated first and second resistance temperature sensors. In various embodiments controller 660 can be in appropriate electrical communication with heaters. Thus, controller 660 can be configured to control the amount of heat produced by the heaters, and hence how much heat is transferred to first and second ring resonators.

Controller 660 generally is also in electrical communication with first ring-temperature sensor, second ring-temperature sensor and filter chip temperature sensor. Controller 660 is configured to receive input from first ring-temperature sensor, second ring-temperature sensor and filter chip temperature sensor, and to control heaters based on the received input. In an embodiment, controller 660 is also in electrical communication with gain chip 104 and is configured to control one or more operations of gain chip 104. In some embodiments, controller 660 can perform a simple iterative temperature adjustment with small increments to the heaters to adjust the temperatures in appropriate directions. However, more elaborate feedback loops can be used, such as a proportional-integral-derivative approaches.

Figure 7:
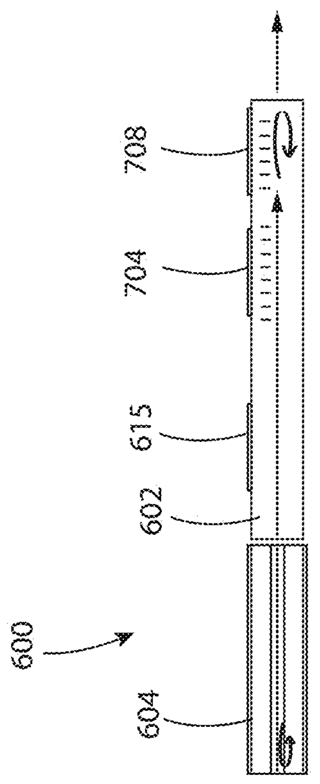
FIG. 7 depicts a side view of a tunable solid-state laser device that functionally depicts the silicon photonic filter chip and semiconductor-based gain chip, according to one or more embodiments of the disclosure.

Referring additionally to FIG. 7, this configuration is functionally depicted in a schematic side view of a tunable solid-state laser device 600 as configured in FIG. 6 to depict functional relationships. In various embodiments, this configuration provides for lasing from the silicon photonic chip 602 as the filter/reflector are continued and joined at an optical connector where the resonance light can constructively interfere and continue propagation to the second edge 642. For clarity, ring heaters 704 and 708 are depicted in a staggered relationship, although in a side view they would generally be aligned. In various embodiments, to provide appropriate leaking from a partial reflection to provide for lasing, the interface of the split waveguide arms with the respective ring resonators can be designed with appropriate reduced coupling. For example, in certain embodiments if the coupling between the waveguide portions and the respective rings are tuned away from 50:50, the Sagnac interferometer functions as a partial mirror that reflects most but not all the light from the gain chip. In or more embodiments, the chip 602 can be connected to another silicon photonic circuit or the like using a transparent adhesive or other suitable connector.

Figure 8:
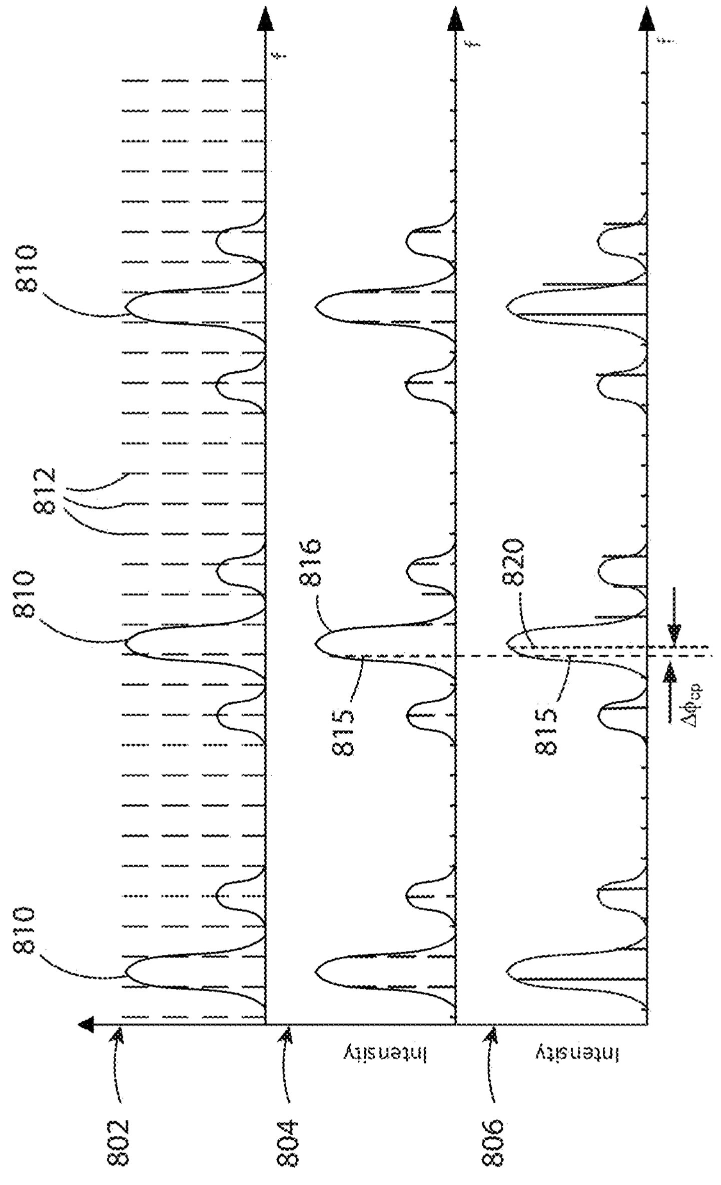
FIG. 8 depicts a diagram of frequency versus intensity for stages of frequency chirping/tuning, according to one or more embodiments of the disclosure.

Referring to FIG. 8, a schematic depiction of chirping based on modulating the cavity phase is shown with alignment of various frequencies for chirping/tuning depicted in a series of diagrams 802, 804, 806, plotting frequency versus intensity with arbitrary scaling. As described above, in various embodiments the silicon photonic filter chips comprise one or more ring resonators that are configured to function as optical filters that select appropriate frequencies. As such, depicted in diagram 802, a plurality of resonance frequencies 810 is shown each indicating the filtered reflection from the ring resonators including the frequency and intensity of the filtered transmissions. In addition, Diagram 802 depicts a plurality of cavity modes 812, each indicating a frequency of the mode, overlaid with the plurality of filter resonance frequencies. The cavity modes are depicted essentially as simply sharp lines, while the filter resonance is shown with a relatively small but finite width to the resonance peak. As depicted in 802, the plurality of cavity modes are longitudinal modes each corresponding to a different frequency.

Diagram 804 indicates an initial lasing frequency where a cavity mode 815 overlaps with a filtered resonance frequency 816. In such embodiments, the initial lasing frequency is then chirped or tuned across the resonance peak 816, for example by using the heater and waveguide assembly with the cavity phase modulator as described herein. For example, diagram 806 depicts a second cavity mode 820 is chirped or tuned to adjust its frequency relative to the initial cavity mode 815. In various embodiments, this process is repeated to sweep the cavity phase mode across some or all of the resonance peaks 816 as desired. To obtain a broadened chirp bandwidth, the filter resonance can be tuned along with the cavity phase to get a broad chirp bandwidth.

Figure 9A:
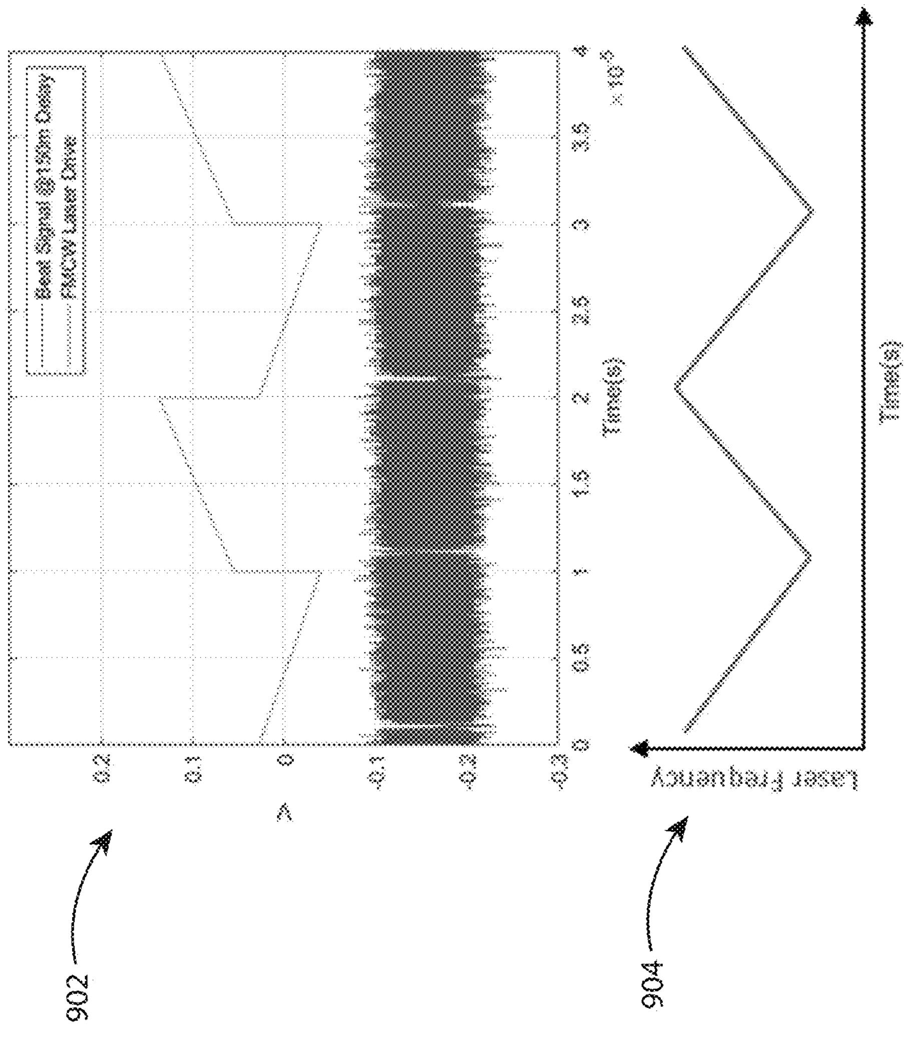
FIGS. 9A-9B depicts diagrams showing a simulated frequency chip versus time corresponding to cavity phase drive signal versus time, according to one or more embodiments of the disclosure.

Referring to FIG. 9A, the frequency chirping can be performed to have a linear time dependence. Silicon thermo-optical perturbations provides a good medium for generating a linear frequency chirp. For example, FIG. 9A depicts diagrams 902, 904 showing laboratory measurements using a prototype of frequency value versus time corresponding to cavity phase drive signal (in volts) versus time. In the simulation, a cavity phase drive signal is driven from an initial value of approximately 0.03 volts to a value of approximately −0.03 volts, corresponding to a minimum frequency value for the chirped frequency. Subsequently the cavity phase drive signal is increased from a value of approximately 0.06 volts to a value of −0.03 volts to increase the chirped frequency back to an initial value. In various embodiments the linear time dependence corresponds to a saw tooth shape, seen in diagram 904, with a linear increase or decrease between a maximum and minimum value. In one or more embodiments the range of the linear frequency variation is the chirp bandwidth. If the chirped laser is used for coherent depth measurement, the chirp bandwidth is related to the measurement resolution, so increased resolution is obtained for a greater bandwidth. Through chirping the cavity phase, a chirp bandwidth on the order of 2-3 GHz can be achieved.

Figure 9B:
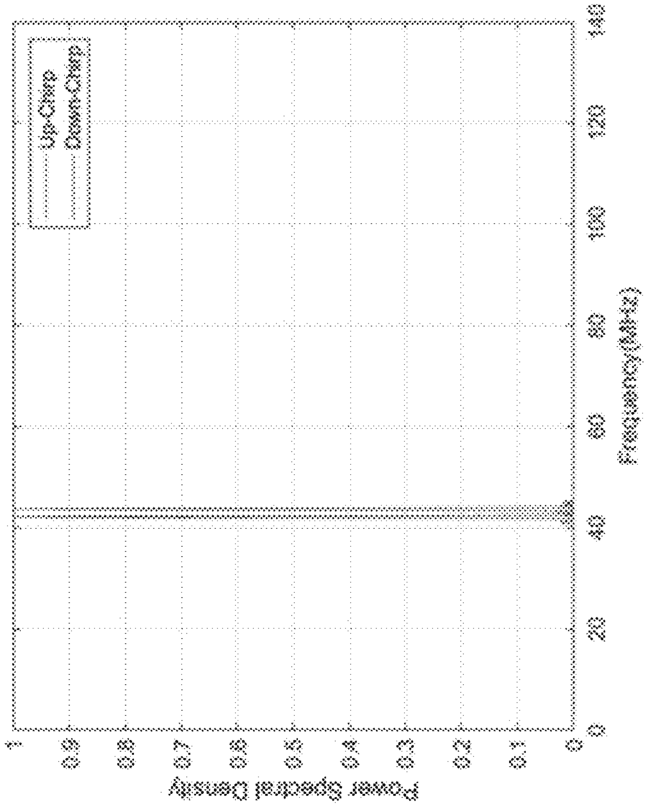

Referring to FIG. 9B, a plot is shown of laser intensity from laboratory measurement as a function of frequency on an up-chirp and a down chirp. The slopes on the up and down chirps are changed slightly relative to each other to allow for the peaks to separate and be separately visible. This also simulates the distinctions in the doppler shift in a LIDAR measurement where the chirps are sifted oppositely. In a LIDAR system the target return signal will have a frequency chirp that is a delayed version of this triangular waveform with additional doppler frequency shifts due to radial velocity of the target. The up-chirp and down-chirp portions of the triangular chirp waveform will acquire opposite sign doppler shifts upon reflection from the target. This will result in a splitting of the interference beat note of the signal and local oscillator beams. FIG. 9B. shows an example of the spectrum of a LIDAR return signal where the magnitude and sign of the splitting of the beat signal can be used to measure the radial velocity.

In various embodiments, to create index change, thermo-optic effect in silicon is linear and index change is a linear function of the temperature $$\Delta\phi = \frac{2\pi}{\lambda}\Delta n_{wg}L_{wg} = \frac{2\pi}{\lambda}\frac{\partial\Delta n_{wg}}{\partial T}\Delta T_{wg}L_{wg},$$

where $$\frac{\partial\Delta n_{wg}}{\partial T}$$

is the Thermo-optic coefficient, $\Delta T_{wg}$ is waveguide temperature change and $L_{wg}$ waveguide length. In certain embodiments, for the lasing cavity mode, laser frequency is proportional to the cavity phase thus linearly changes with waveguide temperature.

$$\Delta f \approx \frac{\partial\Delta n_{wg}}{\partial T}\Delta T_{wg}L_h,$$

where $\Delta f$ is change in laser frequency and $L_h$ is the length of the heater. In one or more embodiments heat power applied to cavity phase section is a function of the modulating drive current.

$$P_H(t)=I(t)^2R_h,$$

where $R_h$ is the heater resistance and $I(t)=I_0\pm\Delta I(t)$.

$$\Delta f\approx 2I\cdot\Delta I(t)+\Delta I(t)^2,$$

where $\Delta I$ is the modulating current. When modulating current is small, waveguide temperature is a linear function of the modulating current, thus creating a linear frequency chirp ($\Delta f\approx 2I\cdot\Delta I(t)$). For the applications herein, the non-linear term is inconsequential.

To achieve wide tuning with no mode hops, the ring filters and the cavity mods should be tuned at the same rate with temperature. The ring filters will tune as $$\Delta f_{ring} \approx \frac{f}{n}\frac{\partial \Delta n_{wg}}{\partial T}\Delta T_{ring}\frac{Lh}{L_{ring}}$$

where $L_h$ is the length of the ring heater and $L_{ring}$ is the circumference of the ring. The cavity modes, however, tune as $$\Delta f_{cav} \approx \frac{f}{n}\frac{\partial \Delta n_{wg}}{\partial T}\Delta T_{ph}\frac{Lph}{L_{cav}},$$

where $L_{ph}$ is the phase heater length, and $L_{cav}$ is the total laser cavity length. The tuning range will be set by limits on the maximum allowable ΔT. To extend the tuning range $\Delta T_{ring}$ should equal $\Delta T_{ph}$ so that both approach the maximum temperature together. In this case, to match tuning rates, it is desirable to set $$\frac{Lh}{L_{ring}} = \frac{Lph}{L_{cav}}.$$

In various embodiments, for large modulation currents, impact of $\Delta I(t)^2$ term can be calibrated out.

Figure 10:
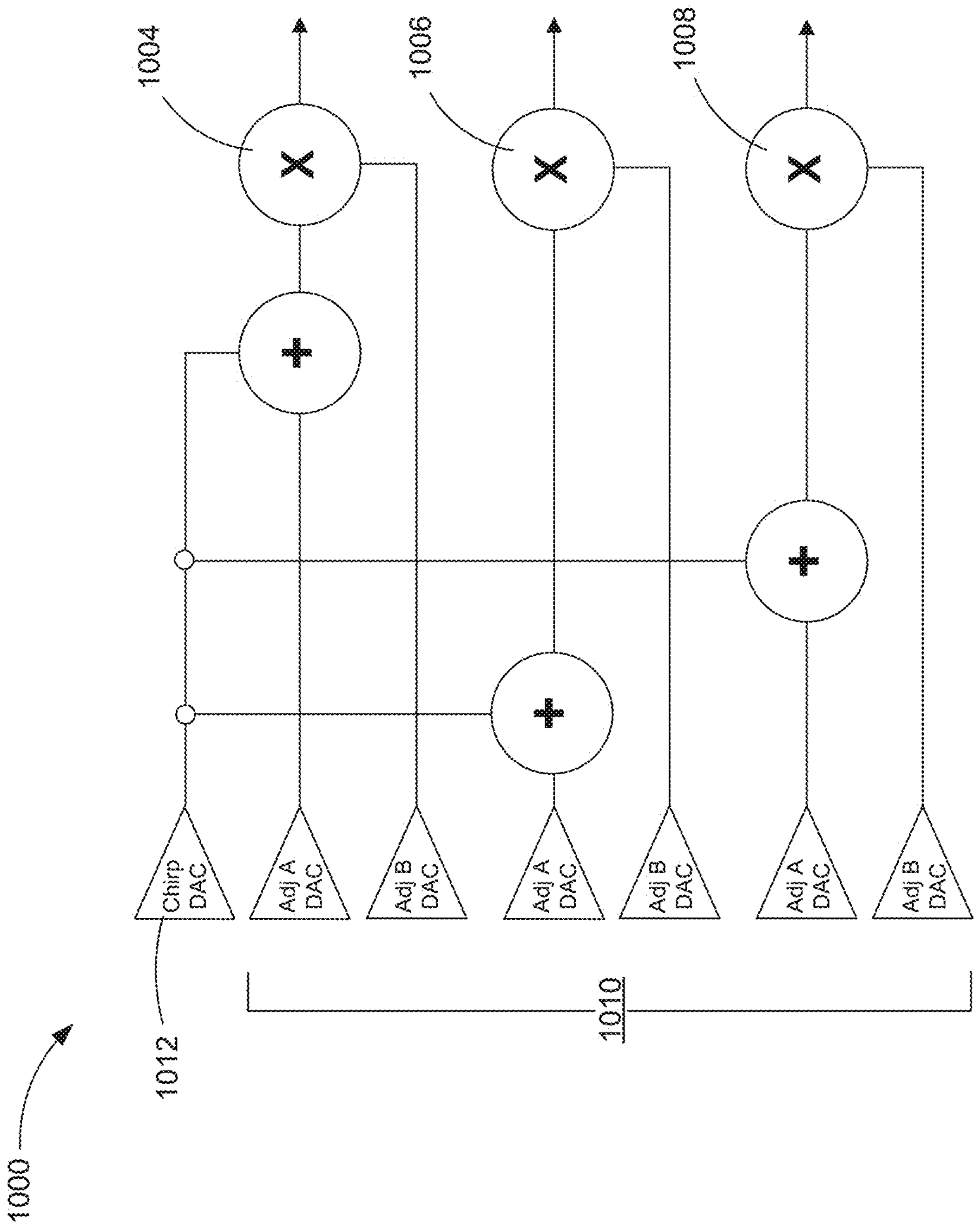
FIG. 10 depicts an electrical diagram showing a high-speed chirping system, according to one or more embodiments of the disclosure.

Referring to FIG. 10, an electrical diagram 1000 is depicted showing a high-speed chirping system, according to one or more embodiments of the disclosure. Electrical diagram 1000 includes three heaters 1004, 1006, 1008 that correspond to the cavity phase modulator and the ring resonators as described above. In various embodiments, the heaters 1004, 1006, 1008 are driven each by a pair of low-speed adjustment digital-to-analog converters (DACs) 1010, used because the heating is proportional to $I^2$ for each heater, that allow for adjustment of current offset and amplitude.

In one or more embodiments, a high-speed chirp DAC 1012 is connected in parallel to each heater by connecting to one of each set of low-speed adjustment DACs 1010. In such embodiments, dynamic trimming can be used to adjust the analog single chirp drive signal so that it can simultaneously drive the 3 heaters 1004, 1006, 1008 for the phase and ring resonators.

In such embodiments, the ring resonators and the cavity phase modulator can be simultaneously tuned/chirped with the same varying current to linearly drive the laser frequency to give a very broad band chirp. In such embodiments, by designing each ring resonator to have the same thermal properties, a single drive signal is thereby able to drive the transmission peak of the tuning along the diagonal of equal ring resonator response. Choosing the cavity phase adjustment signal to have the same response (GHz per mW heating) as the ring resonator drive, the same signal can be used to drive the cavity phase. By chirping the three heaters with a single linearly varying voltage, the chirp voltage can be approximately linear over a very large chirp bandwidth. For example, in certain embodiments a broad band chirp from 150 to 200 GHz bandwidth can be achieved with ring and cavity phase controls. In contrast, in certain embodiments a 2-3 GHz chirp bandwidth is achieved with only cavity phase control. Thus, generally chirping bandwidths within a single laser mode can be achieved from about 2 GHz to about 200 GHz, in further embodiments form about 3 GHz to about 175 GHz, and in other embodiments from about 5 GHz to about 150 GHz. A person of ordinary skill in the art will recognize that additional ranges within the explicit ranges above are contemplated and are within the present disclosure.

Figure 11:
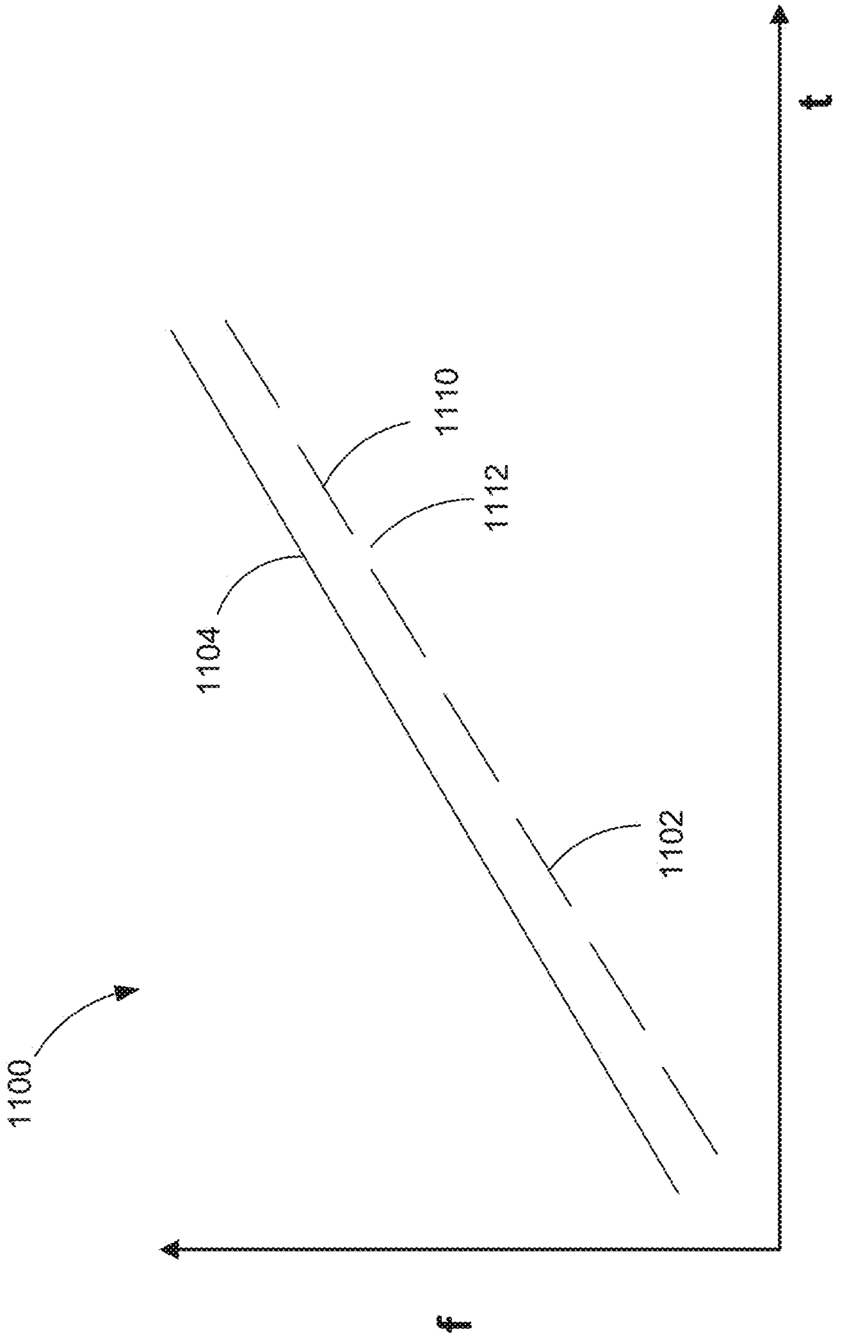
FIGS. 11-12 depict a frequency versus time diagram for a segmented frequency chirp and an ideal frequency chirp, according to one or more embodiments of the disclosure.
Figure 12:
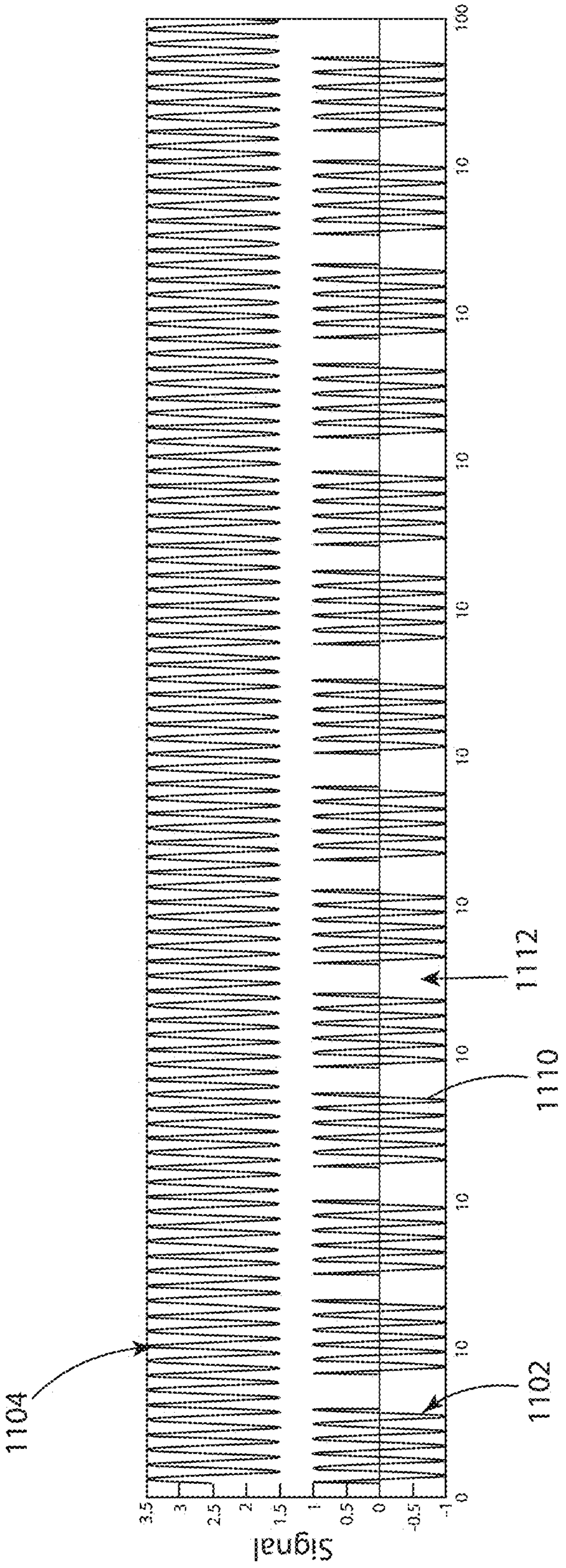

To further extend the chirp bandwidth, the segments within a particular laser mode can be stitched, adjusted for during signal processing, across a mode jump to extend the chirp range. Referring to FIGS. 11-12, a frequency versus time diagram 1100 is depicted comparing a segmented or "stitched" frequency chirp 1102 and an ideal frequency shifted chirp 1104, according to one or more embodiments of the disclosure. In various embodiments, the chirping bandwidth can be further extended by stitching together segments of linear chirping using a phase offset to accurately stitch together the chirping segments. For example, an ideal result of an extended bandwidth is depicted with line which shows a theoretical continuous frequency chirp which extends across a large bandwidth. The frequency of the laser undergoes a small discontinuity in frequency and phase at the mode jump, but an evaluation of this discontinuity can be used to adjust calculations based on the chirp accounting for the discontinuity, which is described herein as the stitching. This is a particularly useful technique for applications such as coherence tomography or industrial metrology, where it is desirable to have a continuous chirp with 5-10 THz or more bandwidth to enable high resolution and precision measurements. As such, in various embodiments a plurality of chirp segments, for example each having a bandwidth of 150 to 200 GHz as discussed above, could be stitched together in the sensing system to generate a larger bandwidth as long as modes with strong laser output are available. For example, this technique could be used to achieve a desired resolution or precision.

However, in practical applications, the continued shifting of the frequency to stitch together chirping segments can result in a mode shift of the laser that results in a loss of coherence with a discontinuous jump in phase. As such, in various embodiments a practical application of the segmented or "stitched" frequency chirp will include one or more segments of frequency bands 1110 separated by one or more gaps 1112. To provide for continued chirp, a correction can be made to enable the stitch.

In particular, laser control circuitry can be configured to stich chirps together with acceptable phase errors using information about the jump at the mode change. For example, in one or more embodiments, as laser wavelength is reaching the limits of the linear tuning range within the same laser mode, the laser control system can adjust the starting phase and frequency as the new mode begins. This may result in a frequency gap, which is acceptable. When lasing in this cavity mode, the laser phase will be different. In such embodiments, optical circuitry can be provided to detect the phase difference, which can be used to stitch the chirped signals. In some embodiments, a delay-line interferometer or a Febry-Perot interferometer can measure laser light from a tap to obtain the frequency and phase for the laser signal that can be applied to do the stitch. For example, in various embodiments a stitched chirp bandwidth of 1.5 THz can be achieved. In some embodiments, a stitched chirp bandwidth of 5 Thz can be achieved.

FIG. 13 is a map of laser output indicated as a photodiode current as a function of heater current to the two ring resonators of an embodiment such as shown in FIG. 1. Effectively, brighter regions represent strong lasing while dark regions represent little or no lasing. Regions of bright spots correspond to laser modes. If considering movement along a diagonal where current to both heaters is increased, laser output is discontinuous when jumping between spots, and the laser frequency shift smoothly until a jump with changes in laser mode. This map can provide conceptual context for understanding chirping where the laser frequency varies until there is a mode change where the frequency and phase undergo a jump with a discontinuity in laser output which then resumes. As described herein, these segments of chirp can be stitched together. With proper design of the resonator and heater properties, the peak lasing intensity can be aligned on the diagonal corresponding to equal heater powers, as shown in FIG. 13. Similarly, adjacent modes are aligned in an organized grid which provides desirable behavior for mode stitching. Expanding the bandwidth within a single mode results in larger spots which reduces or eliminates any stitching needed for a particular overall bandwidth.

Figure 14:
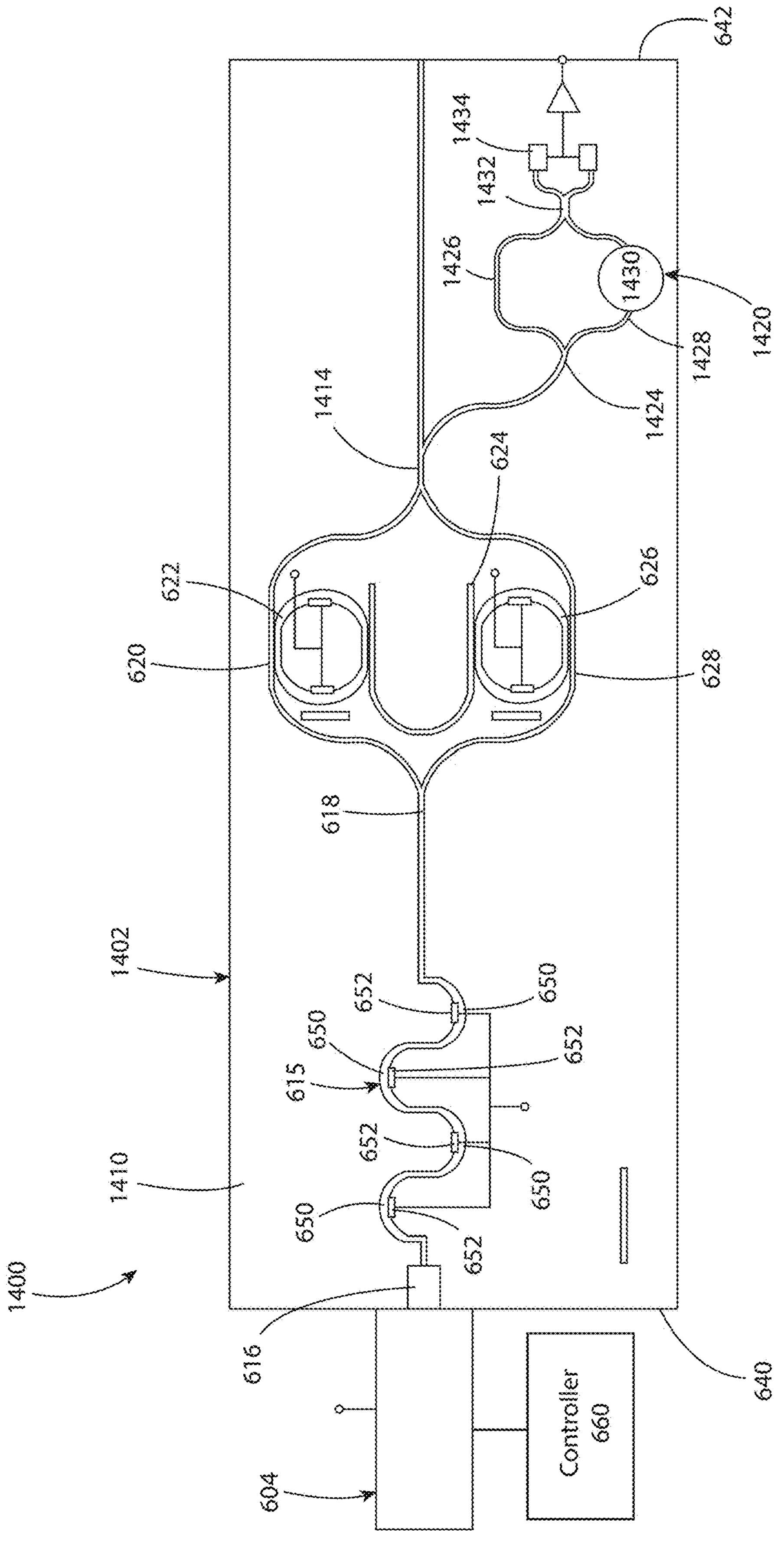
FIG. 14 depicts a schematic top view of an embodiment of the silicon device layer of a tunable solid-state laser device, according to one or more embodiments of the disclosure.

Referring to FIG. 14 a schematic top view of an embodiment of the silicon device layer 1410 of a tunable solid-state laser device 1400 is depicted. As shown in the figure, the solid-state laser device 1400 comprises a silicon photonic filter chip 1402, and a semiconductor-based gain chip 1404 coupled with the photonic filter chip 1402 via a spot-size converter 616 that provides mode size matching. This embodiment is similar to the embodiment in FIG. 6 with the addition of a delay-line interferometer. Depicted in FIG. 14, the silicon device layer 1410 comprises a cavity phase modulator 615, a first splitter-combiner 618, a first waveguide portion 620, a first ring resonator 622, a coupling waveguide portion 624, a second ring resonator 626, a second waveguide portion 628, and a second splitter-combiner 1414. In comparison with the silicon photonic chip depicted in FIG. 6, silicon photonic chip 1402 of FIG. 14 has a delay line interferometer 1420 connected to the second splitter-combiner 1414, although the delay-line interferometer can be connected to a distinct tap. Second splitter-combiner 1414 can be symmetric on the ring resonator side and, if desired, asymmetric on the delay line interferometer side such that the laser intensity is not reduced by 50% to provide for the phase/frequency evaluation using the delay line interferometer.

As shown in FIG. 14, the delay line interferometer 1420 includes a curved section that branches to/from the second splitter-combiner 1414 to a third splitter-combiner 1424 that branches to a third linear waveguide segment 1426 and a fourth linear waveguide segment 1428. In various embodiments a delay line 1430 is positioned in the fourth linear waveguide segment 1428

In various embodiments the third and fourth linear waveguide segment waveguide are rejoined and split at a fourth splitter-combiner 1432 to connect to a pair of photodetectors (PDs) 1434 which in turn are connected to an electrical synchronization pulse that can be used to stitch together the chirp across mode jumps. In some embodiments, the delay line interferometer 1420 can be tapped off of the laser output to provide the accurate phase offset to stitch together the segments of the chirp, although other phase measurements can be used to obtain the phase offset.

Figure 15:
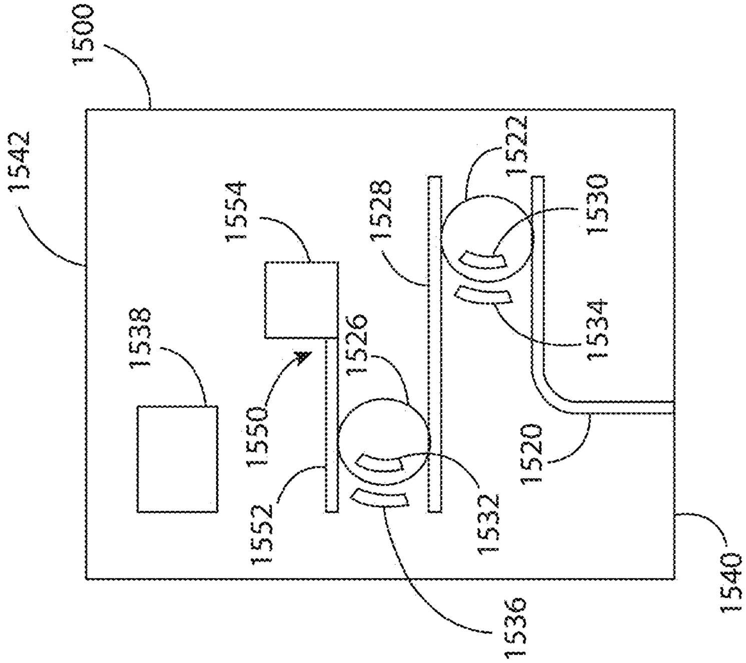
FIG. 15 depicts a top view of another embodiment of a silicon photonic filter chip, the chip having a pair of ring resonators and a waveguide terminating in a reflector.

Referring to FIG. 15 a top view of another embodiment of a silicon photonic filter chip, the chip having a pair of ring resonators and a waveguide terminating in a reflector. In the embodiment depicted in FIG. 15, within the structure provided by the plurality of layers, filter chip 1500 comprises first waveguide portion 1520, first ring resonator 1522, second waveguide portion 1528, second ring resonator 1526, reflector portion 1550, first heater 1530, second heater 1532, first ring-temperature sensor 1534, second ring-temperature 1536 and chip temperature sensor 1538. Filter chip 1500 defines first end (front end) 1540 and second end (rear end) 1542. First waveguide portion 1520, first ring resonator 1522, second waveguide portion 1528, second ring resonator 1526, and reflector portion 1550 form an optical path for transmitting light, the optical path terminating at reflector portion 1550. Light in resonance with the ring resonators reflects back through the optical path while other light generally dissipates.

In an embodiment, first waveguide portion 1520 forms an arced shape with a first generally linear portion that is adjacent front end 1540 of filter chip 1500 and configured for optical communication with a gain chip, a second generally linear portion that is adjacent first ring resonator 1522, and a curved portion joining the first and second linear portions. Second waveguide portion 1528, in an embodiment may be a generally straight, linear waveguide extending laterally between first ring resonator 1522 and second ring resonator 1526. Reflector portion 1550 comprises a reflector in communication with second ring resonator 1526. In an embodiment, reflector portion 1550 may include waveguide portion 1552 and reflector structure 1554. In other embodiments, reflector portion 1550 may only include waveguide 1552 acting as a reflector, or only reflector structure 1554. In an embodiment, reflector structure 1554 may comprise a metallized mirror, a loop reflector, or another known type of optical reflector.

First and second heaters 1530 and 1532 are similar to heaters as described above, and may be selectively controlled by a controller to heat their respective ring resonators 1522 and 1526, thereby changing light frequency, i.e., "tuning" laser. In operation, and in general terms, light from gain chip in resonance with both resonator rings is transmitted into filter chip along first waveguide portion 1520, through first ring resonator 1522, through second waveguide portion 1528, through second ring resonator 1526, and to reflector 1550. Reflector 1550 reflects light back along the path of second ring resonator 1526, second waveguide portion 1528, first ring resonator 1522 and first waveguide portion 1520 for output to gain chip.

Figure 16:
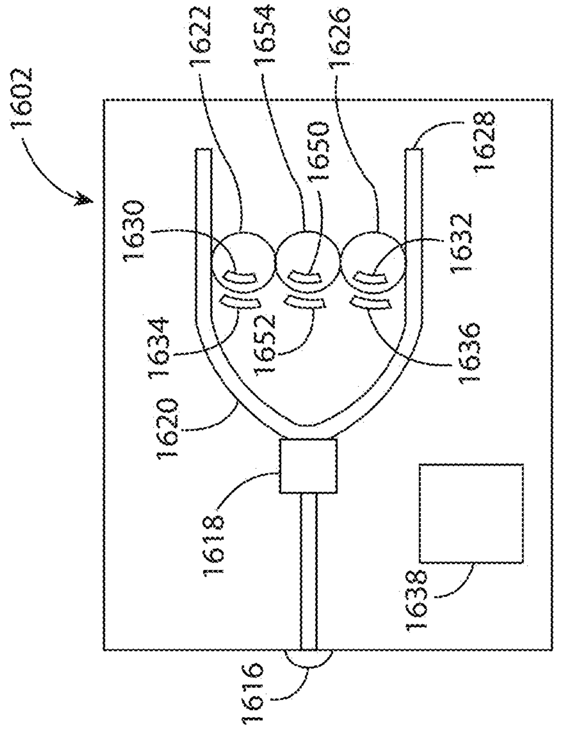
FIG. 16 depicts a top view of yet another embodiment of a silicon photonic filter chip, the chip having a plurality of ring resonators arranged side-by-side.

Referring to FIG. 16, another embodiment of a filter chip 1602 is depicted having a non-interferometer based optical path terminating with a reflector. Filter chip 1602 is similar to chip 102 described above, but includes a series of ring resonators coupled to one another without intervening waveguides. This filter design is adapted from a transmitting optical filter structure in published U.S. patent application 2010/0183312 to Bolla et al., entitled "Method and Device for Hitless Tunable Optical Filtering," incorporated herein by reference.

In an embodiment, as depicted in FIG. 16, filter chip 1602 includes the plurality of chip layers as described above with respect to filter chip 102, as well as first waveguide 1620, initial or first ring resonator 1622, final ring resonator 1626, center ring 1654, initial or first ring heater 1630, final ring heater 1632, central ring heater 1650, initial or first ring-temperature sensor 1634, final ring-temperature sensor 1636, center ring temperature sensor 1652, and chip sensor 1638. First waveguide portion 1620, as depicted in FIG. 16, comprises a straight, linear waveguide extending axially along chip 1602, and is configured to communicate with gain chip at a first end 1640 of filter chip 1602. Although first waveguide portion 1620 is depicted as linear, it will be understood that first waveguide 1620 may define other shapes, such as, but not limited to, the curved shape or other suitable shape.

Filter chip 1602 may include a plurality of two or more ring resonators, including first ring resonator 1622 and final ring resonator 1626, forming a ring resonator series. Additional ring resonators, not depicted, optionally may be located between first and final ring resonators 1622 and 1626. In principle, the third ring resonator can impose a constraint on reflected light such that the light be appropriately in resonance with all three ring resonators, which can result in greater side band suppression. While shown in FIG. 16 with three ring resonators, any odd number of rings can be aligned.

Figure 17:
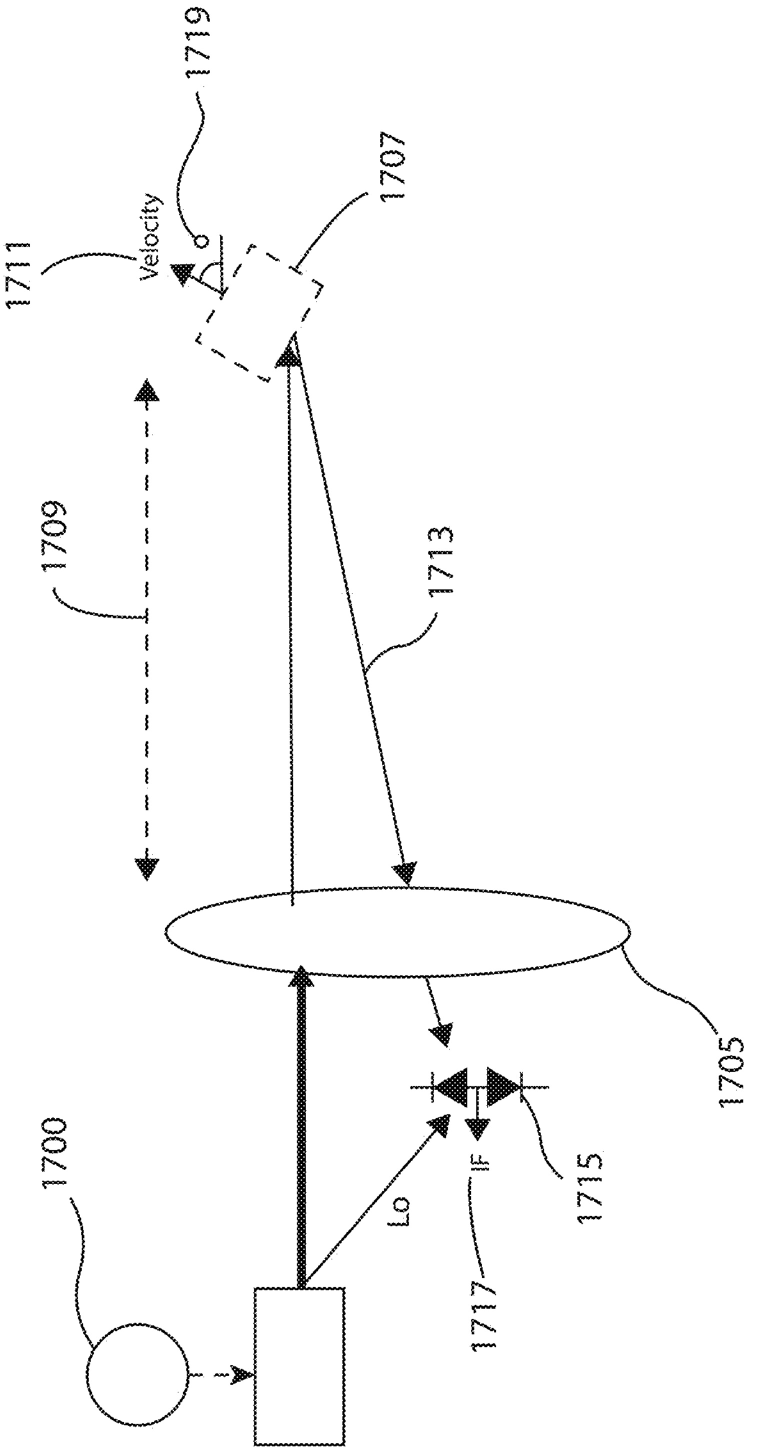
FIG. 17 is a schematic view of a FMCW coherent Lidar configuration.

Coherent Lidar (LIDAR based on FMCW) can provide depth and radial velocity information in a single measurement. Velocity information is obtained through the Doppler shift of the optical frequency of the return signal. In potential Coherent Lidar configurations, optical frequency of the laser can be modulated in a triangular form as shown in FIG. 17. Referring to FIG. 17, an FMCW Coherent LIDAR configuration is shown for a single pixel output with a reflected signal returned.

A laser 1700, such as a narrow line width laser, transmits an optical signal 1701 which may be directly modulated by the laser. The modulated signal passes through a lens 1705 and reflects off target 1707. Target 1707 is located at a particular distance, or range, 1709 from lens 1705. If target is moving, it will also have a velocity 1711 and trajectory 1719. A time delayed optical reflected signal 1713 returns through lens 1705 where it is directed to a mixer 1715, which can be a directional coupler that blends the received signal with a reference signal split from the optical input. A single reflected light beam only senses the component of the velocity along the direction of the light beam.

For performing LIDAR in a FMCW system, laser frequency is linearly chirped in frequency with a maximum chirp bandwidth B and laser output send to the target (Tx signal). Reflected light from the target is mixed with the copy of the Tx signal (local oscillator) in a balanced detector pair. This down converts the beat signal. Frequency of the beat signal represents the target distance and its radial velocity. Radial velocity and distance can be calculated when laser frequency is modulated with a triangular waveform of a linear chirp. This can be implemented in various ways with respect to scanning the field of view to construct the image. In the '386 application cited above, a system is described in detail based on a solid-state beam steering array of pixels with appropriate optics to direct transmitted light to a grid over the field of view and with solid state optical switches performing the switching function. The solid-state beam steering array can be driven by one or a plurality, such as an array, of laser light sources with chirped signals.

Pixel based beam steering described herein allows for using less expensive lasers relative to techniques that rely on phase variance of the adjacent beams to provide a steering function through beam interference. Pixel based beam steering relies on the ability to create effective optical switches with low cross talk integrated along low loss waveguides on an optical chip. A received can be integrated into the chip to provide for a compact transmitter/receiver array. To perform LIDAR, frequency modulation of laser light can be archived through an external modulator or direct modulation of laser. The lasers described herein provide for direct modulation of the laser light for efficient operation. Mixing the laser output (local oscillator) with the time delayed optical field reflected from the target generates a time varying intermediate frequency (IF) useful for assembly of the desired image.

For the performance of laser-based LIDAR, coherent laser light is transmitted in specified locations to cover a field of view and reflected light is received. Interference between the received reflected light and a copy of the transmitted light can be used to assemble an image. The laser signal can be frequency modulated continuous wave (FMCW) light. While the transmission of the light can scanned across the field if view using a mechanical scanner that physically moves a transmitting element, generally focused with a lens, it can be desirable to use a non-moving structure where a transmitting array can selectively scan the field of view from an array of pixels. An array for transmitting and/or receiving laser light is described in the '386 application cited above. If the switching array is constructed around silicon photonic waveguides, the LIDAR structure can be conveniently connected to the silicon photonic external cavity.

In a FMCW system, laser frequency is linearly chirped in frequency with a maximum chirp bandwidth B and laser output send to the target (Tx signal). Reflected light from the target is mixed with the copy of the Tx signal (local oscillator) in a balanced detector pair. This down converts the beat signal. Frequency of the beat signal represents the target distance and its radial velocity. Radial velocity and distance can be calculated when laser frequency is modulated with a triangular waveform, i.e. linear chirp, as described further below. This can be implemented in various ways with respect to scanning the field of view to construct the image. For example, this scanning can be performed based on a solid-state beam steering array of pixels with appropriate optics to direct transmitted light to a grid over the field of view and with solid state optical switches performing the switching function. In the context of the discussion herein, stationary refers to the reference frame of the specific Lidar component, so the solid-state beam steering array is then stationary. The chirping can be accomplished using direct laser modulation or separate modulation of the laser beam. The external cavity lasers described herein provide an efficient platform for broadband direct modulation of the laser signal.

Mixing the laser output (local oscillator) with the time delayed optical field reflected from the target generates a time varying intermediate frequency (IF). IF frequency is a function of range, frequency modulation (chirp) bandwidth (B) and modulation (chirp) period (T), as indicated in Eq. (1), where c is the speed of light.

$$\text{Range}=((f\text{diff\_down}+f\text{diff\_up})/2)\cdot(T\cdot c)/(4\cdot B). \quad (1)$$

The two intermediate frequencies, fdiff_down and fdiff_up) are obtained from the Fourier transform of the signals received by the two receivers and selecting the center frequencies corresponding to the peak of the power spectrum in the Fourier transform. For the case of a moving target, a Doppler frequency shift will be superimposed to IF (shown as change in frequency over the waveform ramp-up and decrease during ramp-down, see FIG. 1B. Note that the Doppler shift is function of target radial velocity and trajectory. The Doppler (radial) velocity can be obtained from the following equation.

$$\text{Doppler Velocity } (V_D)=((f\text{diff\_down}-f\text{diff\_up})/2)\cdot\lambda/2), \quad (2)$$

$$f_{IF}=(f^{+}_{IF}+f^{-}_{IF})/2=((f\text{diff\_down}+f\text{diff\_up})/2). \quad (3)$$

where λ is the laser wavelength. The object velocity (V) is evaluated as $V_D/\text{Co}(\psi_2)$, where $\psi_2$ is the angle between the laser beam direction for an edge of the object and the direction of motion, which is described further below. The beat frequencies can be extracted from Fourier transforms of the sum of the current as a function of time from the balanced detectors using known techniques from coherent detection.

The distance is determined within a particular resolution. Resolution (ΔR): Describes the minimum distance between two resolvable semi-transparent surfaces.— Semi-transparent surfaces closer than minimum distance will show up as a single surface. Resolution is inversely proportional to tuning bandwidth ΔR=0.89 c/B. The distance determination is also evaluated within a particular precision or numerical error. Precision (σR): Describes the measurement accuracy and depends on received signal SNR and chirp bandwidth. Using the large bandwidth chirping described herein allows for obtaining high resolution and precision.

Further Inventive Concepts

1. A tunable solid state laser device comprising:
   a semiconductor based gain chip; and
   a silicon photonic filter chip with tuning capability, wherein silicon photonic filter chip comprises a connection silicon waveguide, at least two ring resonators formed with silicon waveguides, one or more interfacing silicon waveguides couple with the ring resonators, a separate heater associated with each ring resonator and a tap directed to an optical device for evaluating frequency and phase shift to provide for accurate stitching of adjacent chirped frequency ranges to achieve an accurate extended chirped frequency range, wherein the one or more connecting silicon waveguides are configured to redirect light resonant with each of the at least two ring resonators back through the input-output silicon waveguide,
   wherein the connection silicon waveguide of the silicon photonic filter chip is coupled to the semiconductor based gain chip with a spot size convertor to provide for mode size matching to reduce loss due to the interface and wherein chirping the voltage of the heater interfaced with the input-output silicon waveguide chirps the laser output frequency.
2. The tunable solid-state laser of further inventive concept 1 wherein a plurality of chirped frequency ranges are sequentially obtained over staggered frequency ranges that can be assembled together to form an extended stitched chirped range.
3. The tunable solid-state laser of further inventive concept 1 wherein the connection silicon waveguide comprises a cavity phase modulator comprising a heater interfaced with the connection silicon waveguide.
4. The tunable solid-state laser of further inventive concept 3 wherein the connected silicon waveguide comprises one or more curved widened core segments that interface at an inner edge of the curved waveguide with heater elements and wherein ring resonators comprise a widened segment of waveguide to interact with the heater with the heater positioned at the inner edge of the widened waveguide segment.
5. The tunable solid-state laser of further inventive concept 1 wherein the at least two ring resonators have thermal response designed to be approximately the same, and wherein a linearly changing chirp current is sent to heaters associated with the ring resonators and the cavity phase modulator to provide for a broader chirp bandwidth.
6. The tunable solid-state laser of further inventive concept 1 wherein the optical device for evaluating frequency and phase shift comprises a tapped delay-line interferometer.
7. The tunable solid-state laser of further inventive concept 1 wherein the optical device for evaluating frequency and phase shift comprises a Fabry-Perot interferometer.
8. The tunable solid-state laser of further inventive concept 1 wherein a stitched chirp range is at least one THz.
9. A rapidly tunable solid state laser device comprising:
   a semiconductor based gain chip; and
   a silicon photonic filter chip with tuning capability, wherein silicon photonic filter chip comprises a connection silicon waveguide, at least two ring resonators formed with silicon waveguides, one or more connecting silicon waveguides interfacing with the ring resonators, a segment along each ring resonator wherein the waveguide core enlarges at a segment, and a separate heater associated with each ring resonator at the widened segment, wherein the one or more connecting silicon waveguides are configured to redirect light resonant with each of the at least two ring resonators back through the connection silicon waveguide,
   wherein the input-output silicon waveguide of the silicon photonic filter chip is coupled to the semiconductor based gain chip with a spot size convertor to provide for mode size matching to reduce loss due to the interface.
10. The rapidly tunable solid-state laser device of further inventive concept 9 further comprising a temperature sensor configured to measure the chip temperature, and a controller connected to the temperature sensor and the separate heaters and programmed with a feedback loop to maintain the filter temperature to provide the tuned frequency.
11. The rapidly tunable solid-state laser device of further inventive concept 9 wherein the one or more interfacing silicon waveguides are two interfacing silicon waveguides that branch at splitter/coupler connected to the connecting waveguide, each interfacing silicon waveguides coupling to separate respective ring resonator, and further comprising a coupling element coupling the respective ring resonators while reversing the direction of light propagation relative to the gain chip.
12. The rapidly tunable solid-state laser device of further inventive concept 9 wherein the silicon photonic chip further comprises a distal coupler and lasing waveguide connected to the distal coupler, wherein the two interfacing silicon waveguides connect to the distal coupler that couples the respective optical signals in an interfering configuration with lasing output transmitted from the lasing waveguide off of the silicon photonic chip.
13. The rapidly tunable solid-state laser device of further inventive concept 9 wherein the connection silicon waveguide comprises a widened waveguide segment connected with single mode waveguide segment with a cavity phase modulator interfaced with the widened waveguide segment.
14. The rapidly tunable solid-state laser device of further inventive concept 13 wherein the widened waveguide segment is curved.
15. The rapidly tunable solid-state laser device of further inventive concept 13 wherein the cavity phase modulator and the two ring heaters are designed for adjusting the current simultaneously to all three heaters to chirp the laser voltage.

16. The rapidly tunable solid-state laser of further inventive concept 13 wherein the at least two ring resonators have thermal response designed to be approximately the same, and wherein a linearly changing chirp current is sent to heaters associated with the ring resonators and the cavity phase modulator to provide for a broader chirp bandwidth.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understand that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated. The use of the term "about" herein refers to imprecision due to the measurement for the particular parameter as would be understood by a person f ordinary skill in the art, unless explicitly indicated otherwise.

What is claimed is:

1. A tunable solid-state laser device comprising:

a semiconductor-based gain chip; and a silicon photonic filter chip with tuning capability, wherein the silicon photonic filter chip comprises:

a connection silicon waveguide, a heater interfaced with the connection silicon waveguide, at least two ring resonators formed with silicon waveguides, one or more interfacing silicon waveguides coupled with the at least two ring resonators, and a respective heater associated with each ring resonator of the at least two ring resonators, wherein the one or more interfacing silicon waveguides are configured to redirect light resonant with each of the at least two ring resonators back through the connection silicon waveguide, wherein a chirp signal is sent simultaneously to the respective heater associated with each ring resonator to extend a chirped bandwidth, wherein the at least two ring resonators are designed to have the same thermal properties such that a single signal can provide for a synchronized chirp of the at least two ring resonators, wherein a cavity phase is modulated using:

a controller configured to adjust a driving power to the semiconductor-based gain chip;

a cavity phase modulator on the silicon photonic filter chip; or both the controller and the cavity phase modulator, wherein the connection silicon waveguide of the silicon photonic filter chip is coupled to the semiconductor-based gain chip with a spot size converter to provide for mode size matching to reduce loss due to an interface between the connection silicon waveguide and the semiconductor-based gain chip, and wherein chirping a voltage of the heater interfaced with the connection silicon waveguide chirps a laser output frequency.

2. The tunable solid-state laser device of claim 1, wherein the chirp signal is further sent simultaneously to the heater interfaced with the connection silicon waveguide, and wherein the single signal can provide for the synchronized chirp by designing an adjustment signal of the cavity phase modulator to have the same response as the at least two ring resonators.

3. The tunable solid-state laser device of claim 1, wherein the chirp signal is further sent simultaneously to the semiconductor-based gain chip.

4. The tunable solid-state laser device of claim 1, wherein the one or more interfacing silicon waveguides are two interfacing silicon waveguides that branch at a splitter/coupler connected to the connection silicon waveguide, wherein each interfacing silicon waveguide, of the one or more interfacing silicon waveguides, is coupled to a respective ring resonator of the at least two ring resonators, and wherein the tunable solid-state laser device further comprises a coupling element configured to couple to the at least two ring resonators while reversing a direction of light propagation relative to the semiconductor-based gain chip.

5. The tunable solid-state laser device of claim 4, wherein the silicon photonic filter chip further comprises a distal coupler and a lasing waveguide connected to the distal coupler, wherein the one or more interfacing silicon waveguides are configured to connect to the distal coupler, and wherein the distal coupler is configured to couple respective optical signals of the one or more interfacing silicon waveguides in an interfering configuration with lasing output transmitted from the lasing waveguide.

6. The tunable solid-state laser device of claim 1, wherein the semiconductor-based gain chip comprises indium phosphide.

7. The tunable solid-state laser device of claim 1, wherein the at least two ring resonators comprise one or more widened silicon waveguide segments between single mode waveguides, and wherein the respective heater associated with each ring resonator is located at least in part at or near the one or more widened silicon waveguide segments.

8. The tunable solid-state laser device of claim 1, wherein the connection silicon waveguide comprises a widened waveguide segment connected with a single mode waveguide segment and the cavity phase modulator.

9. The tunable solid-state laser device of claim 8, wherein the widened waveguide segment is curved.

10. The tunable solid-state laser device of claim 1, wherein the cavity phase modulator and the respective heater associated with each ring resonator are designed for adjusting a current simultaneously to the respective heater associated with each ring resonator and to the heater interfaced with the connection silicon waveguide to chirp the laser output frequency.

11. The tunable solid-state laser device of claim 10, wherein a linear variation of heater power provides a linear laser frequency chirp.

12. The tunable solid-state laser device of claim 10, further comprising:

a temperature sensor configured to measure a temperature of the silicon photonic filter chip; and a controller connected to the temperature sensor.

13. The tunable solid-state laser device of claim 12, wherein a baseline current is supplied to the respective heater associated with each ring resonator and to the heater interfaced with the connection silicon waveguide, and wherein the baseline current is distinct from the current to chirp the laser output frequency.

14. The tunable solid-state laser device of claim 10, further comprising a tap connected to the connection silicon waveguide and directed to an optical device for evaluating frequency and phase shift.

15. The tunable solid-state laser device of claim 14, wherein a plurality of chirped frequency ranges are sequentially obtained over staggered frequency ranges to form an extended stitched chirped range.

16. A high-resolution fast-response light detection and ranging (LIDAR) imaging system comprising:

an imaging system comprising a transmitter and a receiver configured to receive reflected light, wherein the transmitter projects light in a plurality of directions to assemble a three-dimensional image of objects in a field of view of the imaging system, and wherein the transmitter comprises the tunable solid-state laser device of claim 1.

17. A tunable solid-state laser device comprising:

a semiconductor-based gain chip; and a silicon photonic filter chip with tuning capability, wherein the silicon photonic filter chip comprises:

a connection silicon waveguide, a heater interfaced with the connection silicon waveguide, at least two ring resonators formed with silicon waveguides, one or more interfacing silicon waveguides coupled with the at least two ring resonators, and a respective heater associated with each ring resonator of the at least two ring resonators, wherein a chirp signal is sent simultaneously to the respective heater associated with each ring resonator to extend a chirped bandwidth, wherein the at least two ring resonators are designed to have the same thermal properties such that a single signal can provide for a synchronized chirp of the at least two ring resonators, wherein the connection silicon waveguide of the silicon photonic filter chip is coupled to the semiconductor-based gain chip with a spot size converter to provide for mode size matching to reduce loss due to an interface between the connection silicon waveguide and the semiconductor-based gain chip, and wherein chirping a voltage of the heater interfaced with the connection silicon waveguide chirps a laser output frequency.

18. The tunable solid-state laser device of claim 17, wherein the chirp signal is further sent simultaneously to the semiconductor-based gain chip.

19. The tunable solid-state laser device of claim 17, wherein the chirp signal is further sent simultaneously to the heater interfaced with the connection silicon waveguide.

20. The tunable solid-state laser device of claim 17, wherein the at least two ring resonators comprise one or more widened silicon waveguide segments between single mode waveguides, and wherein the respective heater associated with each ring resonator is located at least in part at or near the one or more widened silicon waveguide segments.

21. A tunable solid-state laser device comprising:

a semiconductor-based gain chip; and a silicon photonic filter chip with tuning capability, wherein the silicon photonic filter chip comprises:

a connection silicon waveguide coupled to the semiconductor-based gain chip, a heater interfaced with the connection silicon waveguide, at least two ring resonators formed with silicon waveguides, one or more interfacing silicon waveguides coupled with the at least two ring resonators, and a respective heater associated with each ring resonator of the at least two ring resonators, wherein the one or more interfacing silicon waveguides are configured to redirect light resonant with each of the at least two ring resonators back through the connection silicon waveguide, wherein a chirp signal is sent simultaneously to the respective heater associated with each ring resonator to extend a chirped bandwidth, wherein the at least two ring resonators are designed to have the same thermal properties such that a single signal can provide for a synchronized chirp of the at least two ring resonators, wherein a cavity phase is modulated using:

a controller configured to adjust a driving power to the semiconductor-based gain chip;

a cavity phase modulator on the silicon photonic filter chip; or both the controller and the cavity phase modulator, and wherein chirping a voltage of the heater interfaced with the connection silicon waveguide chirps a laser output frequency.

22. The tunable solid-state laser device of claim 21, wherein the chirp signal is further sent simultaneously to the semiconductor-based gain chip.

23. The tunable solid-state laser device of claim 21, wherein the chirp signal is further sent simultaneously to the heater interfaced with the connection silicon waveguide.

24. The tunable solid-state laser device of claim 21, wherein the at least two ring resonators comprise one or more widened silicon waveguide segments between single mode waveguides, and wherein the respective heater associated with each ring resonator is located at least in part at or near the one or more widened silicon waveguide segments.

* * * * *